(12) United States Patent
Sayyed et al.

(10) Patent No.: US 12,650,909 B2
(45) Date of Patent: Jun. 9, 2026

(54) ASSESSING DISPLAY HEALTH IN RESPONSE TO ACCIDENTS

(71) Applicant: Dell Products, L.P., Round Rock, TX (US)

(72) Inventors: Ibrahim Sayyed, Georgetown, TX (US); Anand Prakash Joshi, Round Rock, TX (US); Daniel L. Hamlin, Round Rock, TX (US); Balasingh P. Samuel, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 27 days.

(21) Appl. No.: 18/522,768

(22) Filed: Nov. 29, 2023

(65) Prior Publication Data

US 2025/0173233 A1     May 29, 2025

(51) Int. Cl.
*G06F 11/27*         (2006.01)
*G01R 31/317*       (2006.01)
(52) U.S. Cl.
CPC ........ *G06F 11/27* (2013.01); *G01R 31/31724* (2013.01)

(58) Field of Classification Search
CPC   G06F 11/3058; G06F 11/27; G01R 31/31724
See application file for complete search history.

(56) References Cited

U.S. PATENT DOCUMENTS

| | | | |
|---|---|---|---|
| 2009/0309745 A1* | 12/2009 | Johnson .............. | G06F 11/3058 |
| | | | 340/635 |
| 2011/0074664 A1* | 3/2011 | Lebrun .................. | G09G 3/006 |
| | | | 345/98 |
| 2019/0227616 A1* | 7/2019 | Jenne ..................... | G06F 9/4406 |
| 2019/0386742 A1* | 12/2019 | Chaiken .............. | H04B 10/116 |
| 2020/0097241 A1* | 3/2020 | You ..................... | G06F 11/0784 |
| 2020/0409781 A1* | 12/2020 | Zhen .................. | G06F 11/3006 |
| 2021/0286002 A1* | 9/2021 | Song ..................... | G09G 3/006 |
| 2023/0054156 A1* | 2/2023 | Sin .......................... | G09G 3/006 |

* cited by examiner

*Primary Examiner* — Philip Guyton
*Assistant Examiner* — Sean Kevin Mcnamara
(74) *Attorney, Agent, or Firm* — Fogarty LLP

(57)         ABSTRACT

Systems and methods for assessing display health in response to accidents are described. In some embodiments, an Information Handling System (IHS) may include an Embedded Controller (EC) and a memory coupled to the EC, where the memory comprises program instructions that, upon execution by the EC, cause the IHS to initiate an integrated display's Built-In-Self-Test (BIST) in response to a determination that the IHS suffered an accident.

13 Claims, 12 Drawing Sheets

100

100

500

600

700

800

900

START
1101

RECEIVE EVENT DATA
1102

CALCULATE RISK(S), IDENTIFY DEVICE(S) AT-RISK,
AND SELECT REMEDIATION ACTION(S)
1103

PROACTIVELY EXECUTE REMEDIATION ACTION(S) WITH
RESPECT TO DEVICE(S) AT-RISK DEPENDING UPON THE
CALCULATED RISK(S)
1104

NOTIFY USER AND/OR
CLOUD
1105

END
1106

1100

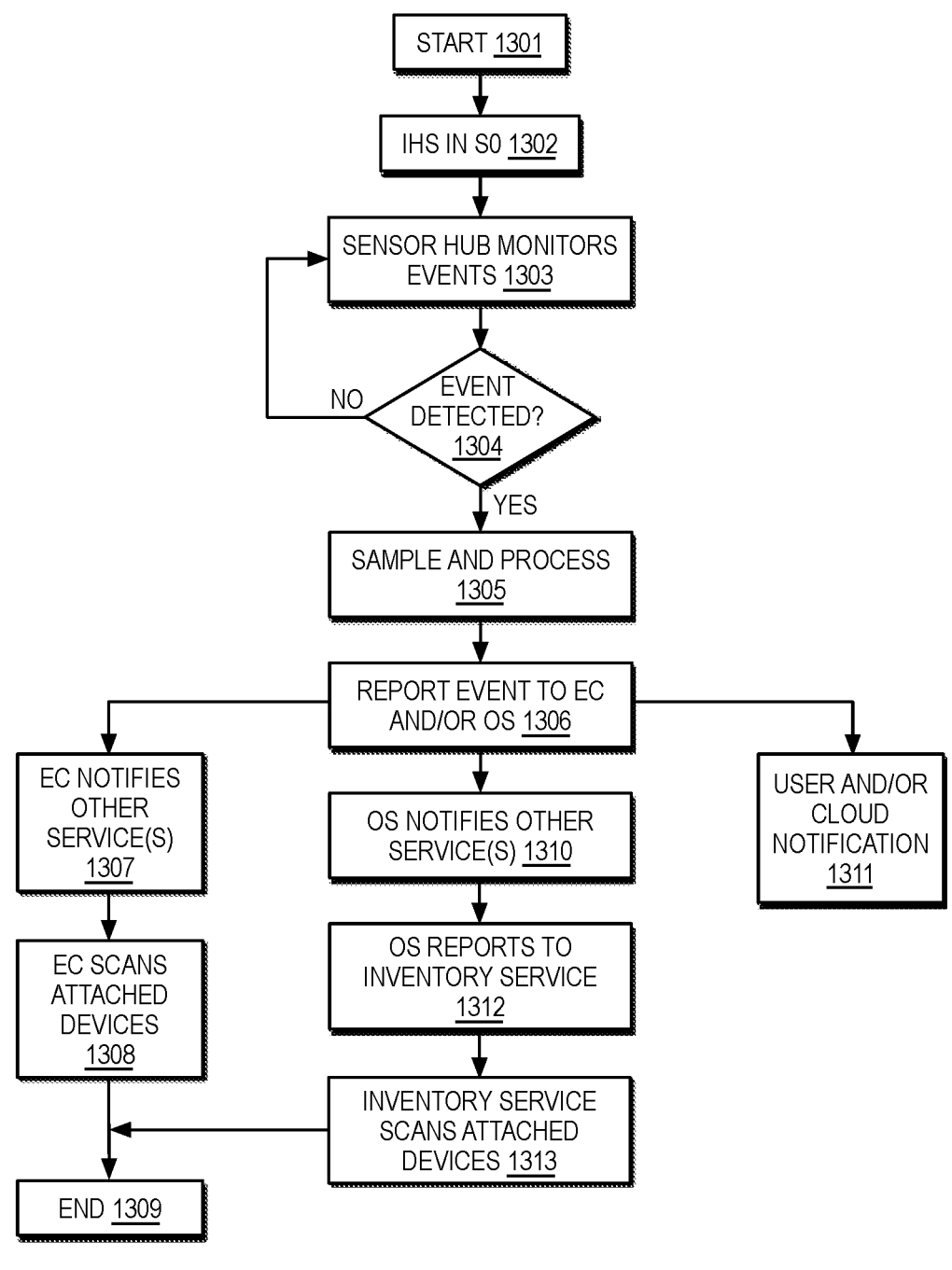

START <u>1301</u>

IHS IN S0 <u>1302</u>

SENSOR HUB MONITORS EVENTS <u>1303</u>

EVENT DETECTED? <u>1304</u>

NO

YES

SAMPLE AND PROCESS <u>1305</u>

REPORT EVENT TO EC AND/OR OS <u>1306</u>

EC NOTIFIES OTHER SERVICE(S) <u>1307</u>

OS NOTIFIES OTHER SERVICE(S) <u>1310</u>

USER AND/OR CLOUD NOTIFICATION <u>1311</u>

EC SCANS ATTACHED DEVICES <u>1308</u>

OS REPORTS TO INVENTORY SERVICE <u>1312</u>

INVENTORY SERVICE SCANS ATTACHED DEVICES <u>1313</u>

END <u>1309</u>

ASSESSING DISPLAY HEALTH IN RESPONSE TO ACCIDENTS

FIELD

This disclosure relates generally to Information Handling Systems (IHSs), and more specifically, to systems and methods for assessing display health in response to accidents.

BACKGROUND

As the value and use of information continues to increase, individuals and businesses seek additional ways to process and store it. One option available to users is an Information Handling System (IHS). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use, such as financial transaction processing, airline reservations, enterprise data storage, or global communications. In addition, IHSs may include a variety of hardware and software components that may be configured to process, store, and communicate information and may include one or more computer systems, data storage systems, and networking systems.

Over the past decade, mobile IHS (e.g., laptops, tablets, smartphones, etc.) sales have outpaced desktop IHS sales due to the convenience and versatility they bring to users. In most markets, laptops typically outsell desktops by a factor of two or more.

As the inventors hereof have recognized, increased mobility also dramatically increases the chances for accidents, such as when a user drops their IHS, often resulting in damage. In some cases, the damage may be observable (e.g., a cracked screen). In other cases, however, the damage may be hidden from sight (e.g., a hard disk failure) and may manifest itself much later as difficult-to-diagnose errors.

As a result, mobile IHSs place additional support burdens on Original Equipment Manufacturers (OEMs), such as the additional time it takes to diagnose a problem due to an accident, a technician's reduced ability to troubleshoot or "root cause" event(s) that might have given rise to a problem, difficulties in determining whether repair and/or replacement are covered under a warranty, etc.

SUMMARY

Systems and methods for accident detection and handling are described. In an illustrative, non-limiting embodiment, an Information Handling System (IHS) may include an Embedded Controller (EC) and a memory coupled to the EC, where the memory includes program instructions that, upon execution by the EC, cause the IHS to initiate an integrated display's Built-In-Self-Test (BIST) in response to a determination that the IHS suffered an accident.

To determine that the IHS suffered the accident, the EC may be configured to check an accident flag or register prior to a reboot of the IHS. The accident may include at least one of: a drop, a fall, a throw, a hit, a crash, an impact, or a collision involving the IHS or a component thereof. In some cases, the accident may take place while the IHS is in Modern Standby or low-power state.

The program instructions, upon execution by the EC, may cause the IHS to enter an S5 state prior to initiation of the BIST. To initiate the BIST, the program instructions, upon execution by the EC, may cause the IHS to communicate with a display controller.

The BIST may be configured to measure one or more electrical currents. The electrical current is indicative of an image noise level. Additionally, or alternatively, the BIST is configured to determine, based at least in part upon the measurement, whether the integrated display has suffered damage. The BIST may be configured to identify, based at least in part upon the one or more electrical currents, at least one of: a type of damage, or a severity of the damage.

The program instructions, upon execution by the EC, may cause the IHS to identify the type or severity of the damage based, at least in part, upon a policy. Additionally, or alternatively, the program instructions, upon execution by the EC, may cause the IHS to identify the type or severity of the damage based, at least in part, upon execution of an Artificial Intelligence (AI) or Machine Learning (ML) model.

In another illustrative, non-limiting embodiment, a memory device may have program instructions stored thereon that, upon execution by a processor of an IHS, cause the IHS to: determine that the IHS suffered an accident; and initiate an integrated display's BIST, at least in part, in response to the determination.

To determine that the IHS suffered an accident, the program instructions, upon execution, cause an OS to receive an indication of the accident from an EC. The indication may include an Advanced Configuration and Power Interface (ACPI) table or command. Moreover, an Operating System (OS) of the IHS is configured to run a display diagnostics routine based, at least in part, upon the indication.

In yet another illustrative, non-limiting embodiment, a method may include: receiving an instruction, at a Liquid Crystal Display (LCD) controller from an EC within an IHS, to perform a BIST in response to an accident; and providing a result of the BIST to the EC.

The BIST may be configured to measure an image noise level of an LCD display coupled to the IHS. Additionally, or alternatively, the BIST may be configured to determine, based at least in part upon the measurement, whether the LCD display has suffered damage. Additionally, or alternatively, the BIST may be configured to determine whether the LCD display has a cracked screen.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

FIG. 13 is a diagram illustrating an example of a method for detecting and notifying of an ecosystem disruption following an accident, according to some embodiments.

DETAILED DESCRIPTION

Figure 1:
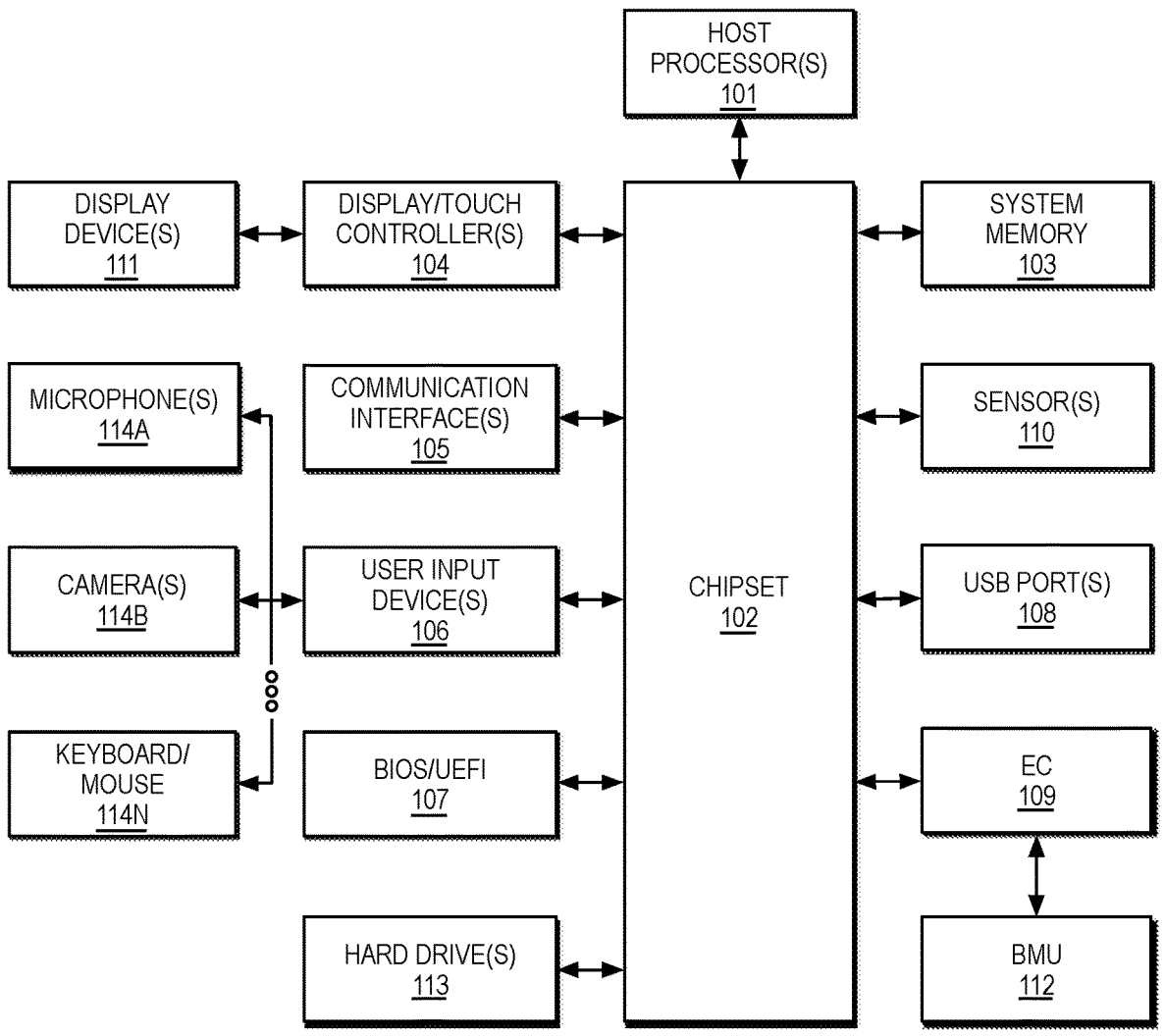
FIG. 1 is a diagram illustrating examples of components of an Information Handling System (IHS), according to some embodiments.

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price.

An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

The terms "heterogenous computing platform," "heterogenous processor," or "heterogenous platform," as used herein, refer to an Integrated Circuit (IC) or chip (e.g., a System-On-Chip or "SoC," a Field-Programmable Gate Array or "FPGA," an Application-Specific Integrated Circuit or "ASIC," etc.) containing a plurality of discrete processing circuits or semiconductor Intellectual Property (IP) cores (collectively referred to as "SoC devices" or simply "devices") in a single electronic or semiconductor package, where each device has different processing capabilities suitable for handling a specific type of computational task. Examples of heterogenous processors include, but are not limited to: QUALCOMM's SNAPDRAGON, SAMSUNG's EXYNOS, APPLE's "A" SERIES, etc., which typically include ARM core(s).

The term "firmware," as used herein, refers to a class of program instructions that provides low-level control for a device's hardware. Generally, firmware enables basic functions of a device and/or provides hardware abstraction services to higher-level software, such as an Operating System (OS) (e.g., WINDOWS, LINUX, MAC OS, etc.). The term "firmware service," as used herein, refers to program instructions that, upon execution by a processing core, deploys services configured to operate without any involvement by the OS.

The term "telemetry data," as used herein, refers to information resulting from in situ collection of measurements or other data by devices within a heterogenous computing platform, or any other IHS device or component, and its transmission (e.g., automatically) to a receiving entity, for example, for accident detection or monitoring purposes. Examples of telemetry data may include, but are not limited to, measurements, metrics, logs, and/or other contextual information related to: whether or how the IHS is moving (e.g., velocity and/or acceleration), a location of the IHS, a bag state (whether the IHS is inside a bag or case), etc.

As used herein, the term "Out-of-Band (OOB)" or "sideband" refers to the use of dedicated interfaces for accessing and managing aspects (e.g., firmware updates, change BIOS settings, collect device inventory, collect telemetry data, etc.) of an IHS from a remote location, through a plane separate from the production network. For example, a form of out-of-band management is referred to as Lights-Out Management (LOM), which employs a dedicated management channel for device maintenance and allows an Information Technology Decision Maker (ITDM) to monitor and manage an IHS by remote control, regardless of whether the IHS is powered on, or whether an OS is installed or operational.

It should be noted that the term "OOB" is used in contradistinction with "in-band," the latter being based upon in-band connectivity (the usual or "production" network channel) and requiring that software be installed on the IHS being managed, which works only after the OS has been successfully booted and networking is brought up.

As used herein, the term "accident" generally describes a drop, a fall (or freefall), a throw, a hit, a crash, an impact, or a collision involving the IHS or a component thereof, regardless of intent and/or damage. In some cases, an accident may happen while the IHS is in an off, low-power, sleep, or standby state, as described below. In other cases, two or more accidents may be collated as part of a larger event. For example, if an IHS is thrown across a room, bounces off a bed, and lands on the ground, each individual "accident" may be collated into a single event.

As noted above, accidents can happen while an IHS is being transported and/or not in operation. It is worth nothing that, to its user, an IHS often only appears to be either "on"

or "off," without any other detectable power states. In many implementations, however, an IHS may support multiple power states that correspond to the states defined in the Advanced Configuration and Power Interface (ACPI) specification, such as: S0, S1, S2, S3, S4, S5, and G3.

For example, when an IHS is operating in S0 mode ("working"), the IHS is fully usable, yet hardware components not in use can still save power by entering a lower power state. In the S0 low-power idle mode ("Sleep" or "Modern Standby") an IHS remains partially running so that it can stay up to date whenever a suitable network is available, wake into S0 mode when real-time action is required (e.g., OS maintenance, etc.), and so on. In this state, an IHS can quickly switch from to a higher-power state in response to hardware and network events.

In the past, S3 used to be the default "Sleep state;" however, now most IHSs have transitioned to Modern Standby, which designates "S0ix" as a hybrid mode of S0, such that all devices are put into their lowest power state but x86 can still execute code such as networking for "connected standby."

When an IHS does not support Modern Standby, it can instead assume any of states S1-S3 (also referred to as "Sleep" modes), where to a user the IHS may appear to be off. Some IHSs support only one or two of these Sleep states. Particularly, the amount of power consumed in states S1-S3 is less than S0 and more than S4. S3 consumes less power than S2, and S2 consumes less power than S1. In states S1-S3, volatile memory is kept refreshed to maintain the IHSs state, and some components remain powered so the IHS can wake from input from the keyboard, Local Area Network (LAN), or a Universal Serial Bus (USB) device. "Hybrid sleep," used only on certain types of IHSs, takes place when the IHS uses a hibernation file with S1-S3. The hibernation file saves the IHS's state in case it loses power while in sleep.

In the S4 state ("Hibernate"), power consumption is reduced to its lowest level. The IHS saves the contents of volatile memory to a hibernation file and some components remain powered so the computer can wake from input from the keyboard, LAN, or a USB device. The working context can be restored if stored on nonvolatile media. "Fast startup" is where the user is logged off before the hibernation file is created, which allows for a smaller hibernation file in IHSs with reduced storage capabilities.

When in the S5 state ("Soft off" or "Full Shutdown"), an IHS is fully shut down without a hibernation file. It occurs when a restart is requested or when an application calls a shutdown Application Programming Interface (API) command. During a full shutdown and boot, the entire user session is torn down and restarted on the next boot, and a boot/startup from S5 takes significantly longer than S1-S4. At the hardware level, the only difference between S4 and S5 is that S4 keeps a flag on the storage device telling the OS bootloader to boot from the hibernation file instead of booting from scratch.

In G3 ("Mechanical off"), the IHS is completely turned off and consumes absolutely no power from its Power Supply Unit (PSU) or main battery (e.g., a lithium-ion battery), with the exception of any Real-Time Clock (RTC) batter(ies) (e.g., Complementary Metal Oxide Semiconductor or "CMOS" batteries, Basic Input/Output System or "BIOS" batteries, coin cell batteries, etc.), which are used to provide power for the IHS's internal clock/calendar and for maintaining certain configuration settings. In some cases, G3 represents the lowest possible power configuration of an IHS from which the IHS can be initialized; all voltage rails are turned off except for RTC rails.

From G3 an IHS typically goes to S5 based on AC insertion (for transition between battery mode to AC mode). Additionally, or alternatively, an IHS may transition from G3 to S0 based upon the detection of a power button event.

As described herein, various operations for accident detection and handling may be performed while an IHS in a state other than S0. For example, in order to collect sensor data, make accident detection determinations, generate mitigation recommendations, and/or execute remediation commands, an Embedded Controller (EC) with the IHS (described in more detail below) may be configured with an always-on power rail or the like, such that the EC continues to communicate with sensors and other IHS components while a host processor of the IHS is in an off, low-power, sleep, or standby state (e.g., S5, Modern Standby, etc.).

FIG. 1 is a block diagram of components of IHS 100. As depicted, IHS 100 includes host processor(s) 101. In various embodiments, IHS 100 may be a single-processor system, or a multi-processor system including two or more processors. Host processor(s) 101 may include any processor capable of executing program instructions, such as an INTEL/AMD x86 processor, or any general-purpose or embedded processor implementing any of a variety of Instruction Set Architectures (ISAs), such as a Complex Instruction Set Computer (CISC) ISA, a Reduced Instruction Set Computer (RISC) ISA (e.g., one or more ARM core(s), or the like).

IHS 100 includes chipset 102 coupled to host processor(s) 101. Chipset 102 may provide host processor(s) 101 with access to several resources. In some cases, chipset 102 may utilize a QuickPath Interconnect (QPI) bus to communicate with host processor(s) 101. Chipset 102 may also be coupled to communication interface(s) 105 to enable communications between IHS 100 and various wired and/or wireless networks, such as ETHERNET, WIFI, BLUETOOTH (BT), cellular or mobile networks (e.g., Code-Division Multiple Access or "CDMA," Time-Division Multiple Access or "TDMA," Long-Term Evolution or "LTE," etc.), satellite networks, or the like.

Communication interface(s) 105 may be used to communicate with peripherals devices (e.g., BT speakers, headsets, etc.). Moreover, communication interface(s) 105 may be coupled to chipset 102 via a Peripheral Component Interconnect Express (PCIe) bus, or the like.

Chipset 102 may be coupled to display and/or touchscreen controller(s) 104, which may include one or more or Graphics Processor Units (GPUs) on a graphics bus, such as an Accelerated Graphics Port (AGP) or PCIe bus. As shown, display controller(s) 104 provide video or display signals to one or more display device(s) 111.

Display device(s) 111 may include Liquid Crystal Display (LCD), Light Emitting Diode (LED), organic LED (OLED), or other thin film display technologies. Display device(s) 111 may include a plurality of pixels arranged in a matrix, configured to display visual information, such as text, two-dimensional images, video, three-dimensional images, etc. In some cases, display device(s) 111 may be provided as a single continuous display, rather than two discrete displays.

Chipset 102 may provide host processor(s) 101 and/or display controller(s) 104 with access to system memory 103. In various embodiments, system memory 103 may be implemented using any suitable memory technology, such as static RAM (SRAM), dynamic RAM (DRAM) or magnetic disks, or any nonvolatile/Flash-type memory, such as a Solid-State Drive (SSD), Non-Volatile Memory Express (NVMe), or the like.

In certain embodiments, chipset 102 may also provide host processor(s) 101 with access to one or more USB ports 108, to which one or more peripheral devices may be coupled (e.g., integrated or external webcams, microphones, speakers, etc.).

Chipset 102 may further provide host processor(s) 101 with access to one or more hard disk drives, solid-state drives, optical drives, or other removable-media drives 113.

Chipset 102 may also provide access to one or more user input devices 106, for example, using a super I/O controller or the like. Examples of user input devices 106 include, but are not limited to, microphone(s) 114A, camera(s) 114B, and keyboard/mouse 114N. Other user input devices 106 may include a touchpad, stylus or active pen, totem, etc. Each of user input devices 106 may include a respective controller (e.g., a touchpad may have its own touchpad controller) that interfaces with chipset 102 through a wired or wireless connection (e.g., via communication interfaces(s) 105). In some cases, chipset 102 may also provide access to one or more user output devices (e.g., video projectors, paper printers, 3D printers, loudspeakers, audio headsets, Virtual/Augmented Reality (VR/AR) devices, etc.).

In certain embodiments, chipset 102 may further provide an interface for communications with one or more hardware sensors 110. Sensor(s) 110 may be disposed on or within the chassis of IHS 100, or otherwise coupled to IHS 100, and may include, but are not limited to: electric, magnetic, radio, optical (e.g., camera, webcam, etc.), infrared, thermal, force, pressure, acoustic (e.g., microphone), ultrasonic, proximity, position, deformation, bending, direction, movement, velocity, rotation, gyroscope, Inertial Measurement Unit (IMU), accelerometer, etc.

Basic Input/Output System (BIOS) 107 is coupled to chipset 102. Unified Extensible Firmware Interface (UEFI) was designed as a successor to BIOS, and many modern IHSs utilize UEFI in addition to or instead of a BIOS. Accordingly, the term "BIOS" is also intended to also encompass a UEFI component. In operation, BIOS 107 provides an abstraction layer that allows the OS to interface with certain hardware components that are utilized by IHS 100.

Upon booting of IHS 100, host processor(s) 101 may utilize program instructions of BIOS 107 to initialize and test hardware components coupled to IHS 100, and to load host OS 300 for use by IHS 100. Via the hardware abstraction layer provided by BIOS 107, software stored in system memory 103 and executed by host processor(s) 101 can interface with certain I/O devices that are coupled to IHS 100.

Embedded Controller (EC) 109 (sometimes referred to as a Baseboard Management Controller or "BMC") includes a microcontroller unit or processing core dedicated to handling selected IHS operations not ordinarily handled by host processor(s) 101.

Examples of such operations may include, but are not limited to: power sequencing, power management, receiving and processing signals from a keyboard or touchpad, as well as operating chassis buttons and/or switches (e.g., power button, laptop lid switch, etc.), receiving and processing thermal measurements (e.g., performing cooling fan control, CPU and GPU throttling, and emergency shutdown), controlling indicator Light-Emitting Diodes or "LEDs" (e.g., caps lock, scroll lock, num lock, battery, ac, power, wireless LAN, sleep, etc.), managing a battery charger and a battery, enabling remote management, diagnostics, and remediation over an OOB or sideband network, etc.

Moreover, in various implementations, EC 109 may be configured to perform operations for accident detection and handling, as described in more detail below. For example, EC 109 may be configured with one or more Artificial Intelligence (AI)/Machine Learning (ML) models configured to detected, in firmware and autonomously with respect to the IHS's OS, whether an accident has taken place, to predict damage to the IHS caused by the accident, to assess contextual information required for evaluating policy rules, etc.

Unlike other devices in IHS 100, EC 109 may be operational from the very start of each power reset, before other devices are fully running or powered on. As such, EC 109 may be responsible for interfacing with a power adapter to manage the power consumption of IHS 100. These operations may be utilized to determine the power status of IHS 100, such as whether IHS 100 is operating from battery power or is plugged into an AC power source. Firmware instructions utilized by EC 109 may be used to manage other core operations of IHS 100 (e.g., turbo modes, maximum operating clock frequencies of certain components, etc.).

As described in more detail below, in various embodiments, EC 109 may be configured to perform a number of accident detection and handling operations, in some cases independently of the state of processor(s) 101, which may be in a, off, low power, sleep, or standby state (e.g., when IHS 100 is being carried with its lid closed, etc.).

EC 109 may also implement operations for detecting certain changes to the physical configuration or posture of IHS 100 and managing other devices in different configurations of IHS 100. For instance, when IHS 100 as a 2-in-1 laptop/tablet form factor, EC 109 may receive inputs from a lid position or hinge angle sensor 110, and it may use those inputs to determine: whether the two sides of IHS 100 have been latched together to a closed position or a tablet position, the magnitude of a hinge or lid angle, etc. In response to these changes, the EC may enable or disable certain features of IHS 100 (e.g., front or rear facing camera, etc.).

In this manner, EC 109 may identify any number of IHS postures, including, but not limited to: laptop, stand, tablet, or book. For example, when display(s) 111 of IHS 100 is open with respect to a horizontal keyboard portion, and the keyboard is facing up, EC 109 may determine IHS 100 to be in a laptop posture. When display(s) 111 of IHS 100 is open with respect to the horizontal keyboard portion, but the keyboard is facing down (e.g., its keys are against the top surface of a table), EC 109 may determine IHS 100 to be in a stand posture. When the back of display(s) 111 is closed against the back of the keyboard portion, EC 109 may determine IHS 100 to be in a tablet posture. When IHS 100 has two display(s) 111 open side-by-side, EC 109 may determine IHS 100 to be in a book posture. In some implementations, EC 109 may also determine if display(s) 111 of IHS 100 are in a landscape or portrait orientation.

In some implementations, EC 109 may be installed as a Trusted Execution Environment (TEE) component to the motherboard of IHS 100. Additionally, or alternatively, EC 109 may be further configured to calculate hashes or signatures that uniquely identify individual components of IHS 100. In such scenarios, EC 109 may calculate a hash value based on the configuration of a hardware and/or software component coupled to IHS 100. For instance, EC 109 may calculate a hash value based on all firmware and other code or settings stored in an onboard memory of a hardware component.

Hash values may be calculated as part of a trusted process of manufacturing IHS 100 and may be maintained in secure storage as a reference signature. EC 109 may later recalculate the hash value for a component may compare it against the reference hash value to determine if any modifications have been made to the component, thus indicating that the component has been compromised. As such, EC 109 may validate the integrity of hardware and software components installed in IHS 100.

In addition, EC 109 may provide an OOB or sideband channel that allows an ITDM or Original Equipment Manufacturer (OEM) to manage IHS 100's various settings and configurations, for example, by issuing OOB commands.

In various embodiments, IHS 100 may be coupled to an external power source through an AC adapter, power brick, or the like. The AC adapter may be removably coupled to a battery charge controller to provide IHS 100 with a source of DC power provided by battery cells of a battery system in the form of a battery pack (e.g., a lithium ion or "Li-ion" battery pack, or a nickel metal hydride or "NiMH" battery pack including one or more rechargeable batteries).

Battery Management Unit (BMU) 112 may be coupled to EC 109 and it may include, for example, an Analog Front End (AFE), storage (e.g., non-volatile memory), and a microcontroller. In some cases, BMU 112 may be configured to collect and store information, and to provide that information to other IHS components, such as, for EC 109 and/or other devices within heterogeneous computing platform 200 (FIG. 2).

Examples of information collectible by BMU 112 may include, but are not limited to: operating conditions (e.g., battery operating conditions including battery state information such as battery current amplitude and/or current direction, battery voltage, battery charge cycles, battery state of charge, battery state of health, battery temperature, battery usage data such as charging and discharging data; and/or IHS operating conditions such as processor operating speed data, system power management and cooling system settings, state of "system present" pin signal), environmental or contextual information (e.g., such as ambient temperature, relative humidity, system geolocation measured by GPS or triangulation, time and date, etc.), etc.

In some embodiments, IHS 100 may not include all the components shown in FIG. 1. In other embodiments, IHS 100 may include other components in addition to those that are shown in FIG. 1. Furthermore, some components that are represented as separate components in FIG. 1 may instead be integrated with other components, such that all or a portion of the operations executed by the illustrated components may instead be executed by the integrated component.

Figure 2:
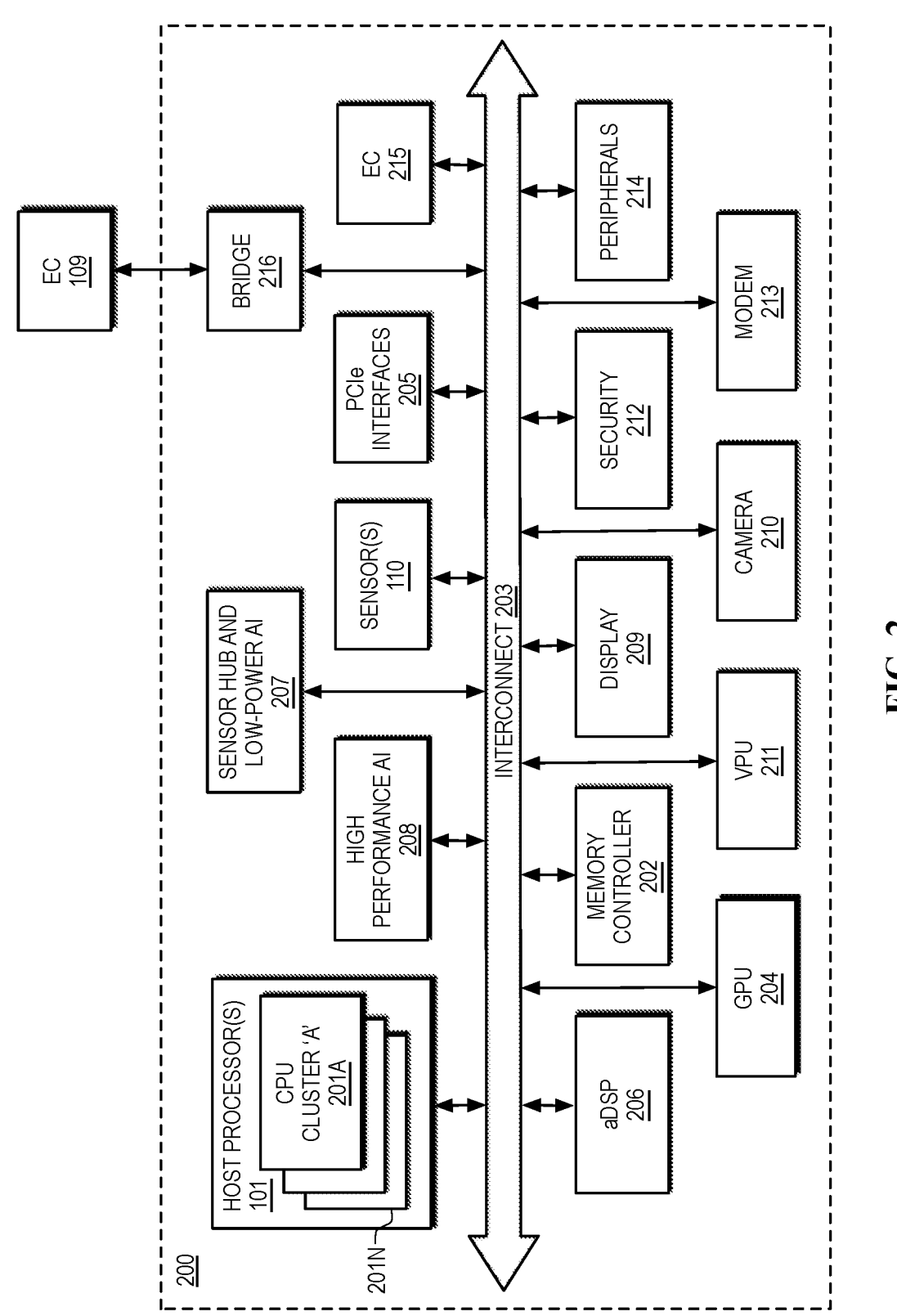
FIG. 2 is a diagram illustrating an example of a heterogenous computing platform, according to some embodiments.

For instance, in various embodiments, host processor(s) 101 and/or other components shown in FIG. 1 (e.g., chipset 102, display controller(s) 104, communication interface(s) 105, EC 109, etc.) may be replaced by devices within heterogenous computing platform 200 (FIG. 2). As such, IHS 100 may assume different form factors including, but not limited to: servers, workstations, desktops, laptops, appliances, video game consoles, tablets, smartphones, etc.

Historically, IHSs with desktop and laptop form factors have had conventional host OSs executed on INTEL or AMD's "x86"-type processors. Other types of processors, such as ARM processors, have been used in smartphones and tablet devices, which typically run thinner, simpler, or mobile OSs (e.g., ANDROID, IOS, WINDOWS MOBILE, etc.).

More recently, however, IHS manufacturers have started producing fully-fledged desktop and laptop IHSs equipped with ARM-based, heterogeneous computing platforms, and host OSs (e.g., WINDOWS on ARM) have been developed to provide users with a more quintessential OS experience on those platforms. As such, in various embodiments described herein, a heterogeneous computing platform may include an integrated EC and/or it may communicate with an external EC via a bridge or the like.

FIG. 2 is a diagram illustrating an example of heterogenous computing platform 200. In various embodiments, heterogenous computing platform 200 may be implemented in an SoC, FPGA, ASIC, or the like. Heterogenous computing platform 200 includes a plurality of discrete or segregated devices or components, each device having a different set of processing capabilities suitable for handling a particular type of computational task. When each device in platform 200 executes only the types of computational tasks it is specifically designed to execute, the overall power consumption of heterogenous computing platform 200 is reduced.

In various implementations, each device in heterogenous computing platform 200 may include its own microcontroller(s) or core(s) (e.g., ARM core(s)) and corresponding firmware. In some cases, a device in platform 200 may also include its own hardware-embedded accelerator (e.g., a secondary or co-processing core coupled to a main core). Each device in heterogenous computing platform 200 may be accessible through a respective Application Programming Interface (API). Additionally, or alternatively, each device in heterogenous computing platform 200 may execute its own OS. Additionally, or alternatively, one or more of these devices may be a virtual device.

In certain embodiments, at least one device in heterogenous computing platform 200 may have updatable firmware which, upon installation, operates to change the performance, available features, settings, configuration options, API, drivers, and/or services provided by that device. For example, each update may be delivered to heterogenous computing platform 200 as a system-wide firmware installation package having a plurality of firmware components, and each firmware component may be distributed to its respective device (or corresponding memory space). In some implementations, the latest system-wide firmware installation package received by heterogenous computing platform 200 may be installed at every boot of IHS 100.

In the example of FIG. 2, heterogenous computing platform 200 includes CPU clusters 201A-N as a particular implementation of host processor(s) 101 intended to perform general-purpose computing operations. Each of CPU clusters 201A-N may include one or more processing core(s) and cache memor(ies). In operation, CPU clusters 201A-N are available and accessible to the IHS's host OS 300 (e.g., WINDOWS on ARM), optimization application(s) 312 (FIG. 3), OS agent(s) 313, and other application(s) 314 executed by IHS 100.

CPU clusters 201A-N are coupled to memory controller 202 via internal interconnect fabric 203. Memory controller 202 is responsible for managing memory accesses for all of devices connected to internal interconnect fabric 203, which may include any communication bus suitable for inter-device communications within an SoC (e.g., Advanced Microcontroller Bus Architecture or "AMBA," QuickPath Interconnect or "QPI," HyperTransport or "HT," etc.). All devices coupled to internal interconnect fabric 203 can communicate with each other and with a host OS executed by CPU clusters 201A-N.

GPU 204 is a device designed to produce graphical or visual content and to communicate that content to a monitor or display, where the content may be rendered. PCIe interfaces 205 provide an entry point into any additional devices external to heterogenous computing platform 200 that have a respective PCIe interface (e.g., graphics cards, USB controllers, etc.).

Audio Digital Signal Processor (aDSP) 206 is a device designed to perform audio and speech operations and to perform in-line enhancements for audio input(s) and output(s). Examples of audio and speech operations include, but are not limited to: noise reduction, echo cancellation, directional audio detection, wake word detection, muting and volume controls, filters and effects, etc.

In operation, input and/or output audio streams may pass through and be processed by aDSP 206, which can send the processed audio to other devices on internal interconnect fabric 203 (e.g., CPU clusters 201A-N). Also, aDSP 206 may be configured to process one or more of heterogenous computing platform 200's sensor signals (e.g., gyroscope, accelerometer, pressure, temperature, etc.), low-power vision or camera streams (e.g., for user presence detection, onlooker detection, etc.), or battery data (e.g., to calculate a charge or discharge rate, current charge level, etc.). To that end, aDSP 206 may be coupled to BMU 112.

Sensor hub and low-power AI device 207 is a very low power, always-on device designed to consolidate information received from other devices in heterogenous computing platform 200, process any context and/or telemetry data streams, and provide that information to: (i) a host OS, (ii) other applications, and/or (iii) other devices in platform 200. For example, sensor hub and low-power AI device 207 may include General-Purpose Input/Output (GPIOs) that provide Inter-Integrated Circuit (I²C), Improved I²C (I³C), Serial Peripheral Interface (SPI), Enhanced SPI (eSPI), and/or serial interfaces to receive data from sensors (e.g., sensors 110, camera 210, peripherals 214, etc.).

Sensor hub and low-power AI device 207 may include an always-on, low-power core configured to execute small neural networks and specific applications, such as contextual awareness and other enhancements. In some embodiments, sensor hub and low-power AI device 207 may be configured to operate as an orchestrator device in charge of managing other devices, for example, based upon a policy or the like.

High-performance AI device 208 is a significantly more powerful processing device than sensor hub and low-power AI device 207, and it may be designed to execute multiple complex AI algorithms and models concurrently (e.g., Natural Language Processing, speech recognition, speech-to-text transcription, video processing, gesture recognition, user engagement determinations, etc.). For example, high-performance AI device 208 may include a Neural Processing Unit (NPU), Tensor Processing Unit (TPU), Neural Network Processor (NNP), or Intelligence Processing Unit (IPU), and it may be designed specifically for AI and Machine Learning (ML), which speeds up the processing of AI/ML tasks while also freeing processor(s) 101 to perform other tasks.

Display/graphics device 209 is designed to perform additional video enhancement operations. In operation, display/graphics device 209 may provide a video signal to an external display coupled to IHS 100 (e.g., display device(s) 111).

Camera device 210 includes an Image Signal Processor (ISP) configured to receive and process video frames captured by a camera coupled to heterogenous computing platform 200 (e.g., in the visible and/or infrared spectrum).

Video Processing Unit (VPU) 211 is a device designed to perform hardware video encoding and decoding operations, thus accelerating the operation of camera 210 and display/ graphics device 209. VPU 211 may be configured to provide optimized communications with camera device 210 for performance improvements.

In some cases, devices 209-211 may be coupled to internal interconnect fabric 203 via a secondary interconnect fabric (not shown). A secondary interconnect fabric may include any bus suitable for inter-device and/or inter-bus communications within an SoC.

Security device 212 includes any suitable security device, such as a dedicated security processor, a Trusted Platform Module (TPM), a TRUSTZONE device, a PLUTON processor, or the like. In various implementations, security device 212 may be used to perform cryptography operations (e.g., generation of key pairs, validation of digital certificates, etc.) and/or it may serve as a hardware root-of-trust (ROT) for heterogenous computing platform 200 and/or IHS 100.

Modem/wireless controller 213 is a device designed to enable all wireless communications in any suitable frequency band (e.g., BLUETOOTH or "BT," WiFi, CDMA, 5G, satellite, etc.), subject to AI-powered optimizations/customizations for improved speeds, reliability, and/or coverage.

Peripherals 214 may include any device coupled to heterogeneous computing platform 200 (e.g., sensors 110) through mechanisms other than PCIe interfaces 205. In some cases, peripherals 214 may include interfaces to integrated devices (e.g., built-in microphones, speakers, and/or cameras), wired devices (e.g., external microphones, speakers, and/or cameras, Head-Mounted Devices/Displays or "HMDs," printers, displays, etc.), and/or wireless devices (e.g., wireless audio headsets, etc.) coupled to IHS 100.

In some cases, devices 212 and 213 may be coupled to internal interconnect fabric 203 via the same secondary interconnect serving devices 209-211 (not shown). Additionally, or alternatively, devices 212-213 may be coupled to internal interconnect fabric 203 via another secondary interconnect.

In various embodiments, one or more devices of heterogeneous computing platform 200 (e.g., GPU 204, aDSP 206, sensor hub and low-power AI device 207, high-performance AI device 208, VPU 211, etc.) may be configured to execute one or more AI model(s), simulation(s), and/or inference(s).

In some implementations, EC 215 may be integrated into heterogenous computing platform 200 of IHS 100. In other implementations EC 109 may be completely external to platform 200 (i.e., it may reside in its own semiconductor package) but coupled to integrated bridge 216 via an interface (e.g., enhanced SPI or "eSPI") to provide or maintain the EC's ability to access the SoC's internal interconnect fabric 203, including sensor hub 207 and sensor(s) 110, allow EC 109C to access and/or run most or all of devices 201-216 and 110 directly. In each of these scenarios, EC 109 may be configured to operate as an orchestrator instead of (or along with) sensor hub and low-power AI device 207.

Figure 3:
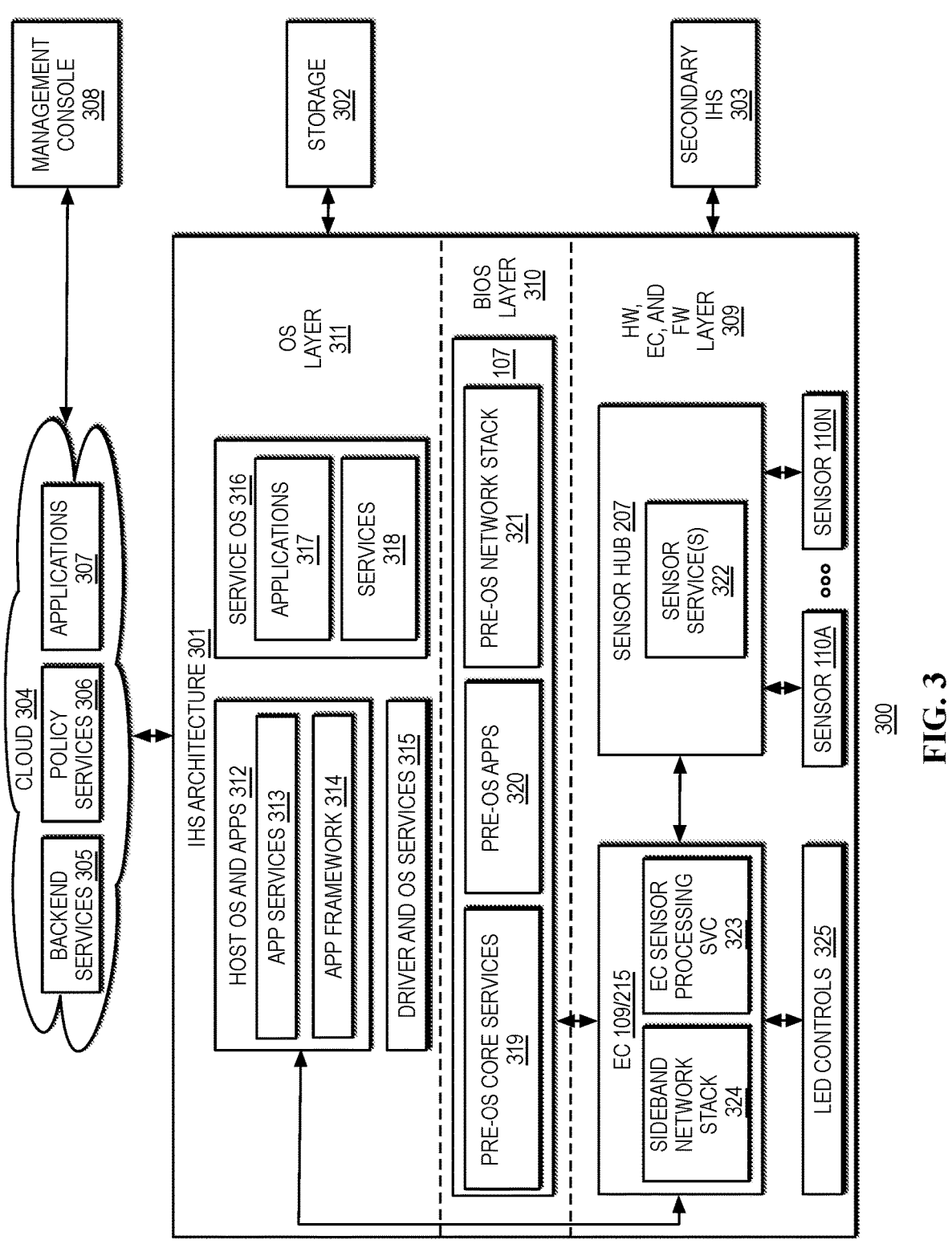
FIG. 3 is a diagram illustrating an example of an architecture for accident detection and handling, according to some embodiments.

FIG. 3 is a diagram illustrating an example of architecture 300 for accident detection and handling. Particularly, architecture 300 includes IHS 301 (e.g., implementing aspects of IHS 100 and/or platform 200) coupled to storage device 302 (e.g., NVMe, SSD, etc.), secondary or companion IHS 303 (e.g., a smart phone, a laptop, etc.), and cloud or remote service 304.

Cloud 304 includes backend or remote services 305, policy services 306, and web applications 307. In some cases, components of cloud 304 may be accessible to IHS 301 and/or secondary IHS 303, and configurable via ITDM management console 308.

IHS architecture 301 includes hardware/EC/firmware layer 309, BIOS layer 310, and OS layer 311. Specifically, OS layer 311 includes host OS and applications 312 executed by host processor(s) 101, which in turn includes applications services 313 and application framework 314. OS layer 311 may also include driver and core OS services 315 and Service OS (SOS) 316, which may include applications 317 and services 318.

BIOS layer 310 includes pre-OS core services 319, pre-OS applications 320, and pre-OS network stack 371 executed by BIOS 107. Hardware/EC/firmware layer 309 includes EC 109/215 (or 215) and sensor hub 207. EC 109/215 is configured to execute EC sensor processing service 323 and sideband network stack 324, and to control one or more LEDs 325 (on a chassis of IHS 100). Sensor hub 207 executes sensor service(s) 322 to communicate with sensor(s) 110.

In operation, architecture 300 may be used to implement methods 400 and/or 500 for accident detection and handling by EC 109/215 and/or OS 312, as well as other operations described in other methods below. For example, in various embodiments, architecture 300 may help to detect damage-resulting incidents, and to act upon them as soon as they happen.

Particularly, IHS architecture 300 may utilize cost-efficient sensors to detect, record, and report events where IHS 100 experiences an accident. Notably, the same architecture may be implemented with configurable parameters and thresholds that can be adjusted in the OEM's factory or dynamically to fit different IHSs or different use cases of the same IHS in a hardware- and OS-agnostic manner that is not necessarily tied to any particular physical sensors, sensor hubs, CPU architecture, or OS.

Architecture 300 may use raw data from sensor(s) 110A-N to recognize damage-causing accidents and perform a local analysis using procedural and/or AI/ML-based models to characterize accidents and events, and to assess the likely impact damage they caused to the IHS. In some cases, for each accident, architecture 300 may enable the identification of: a type of accident (e.g., fall, forceful throw to the ground, collision with wall, punched by user, etc.), a subtype of accident (e.g., if a fall is detected, was it a simple fall or a "compound fall," such as falling down the stairs, etc.), a severity of the accident (e.g., height of drop, duration of the fall, force of impact, whether the IHS was in a case or bag during the accident, etc.), and/or damage prediction and mitigation (e.g., broken screen, disconnected components, etc.).

IHS architecture 300 may also provide actionable alerts for customer service to act on or use as datapoints in troubleshooting, warranty evaluation, etc. Moreover, architecture 300 may provide data for deeper analyses of the raw sensor events and the quality or trustworthiness of the local analyses derived from them across large sets of devices in order to glean further insights that may feedback into the local analysis methodology and/or drive business decisions.

As such, architecture 300 may detect, measure, and classify accidents and predict damage due to accidents, in some cases with SoC 200 and OS-agnostic architectural components. A sideband or OOB processor, such as EC 109/215, may be configured to analyze and transmit shock and accident data and to cloud 504 and/or secondary IHS 303, even when IHS 100 is off, in a low-power state, or in Modern Standby.

Figure 4:
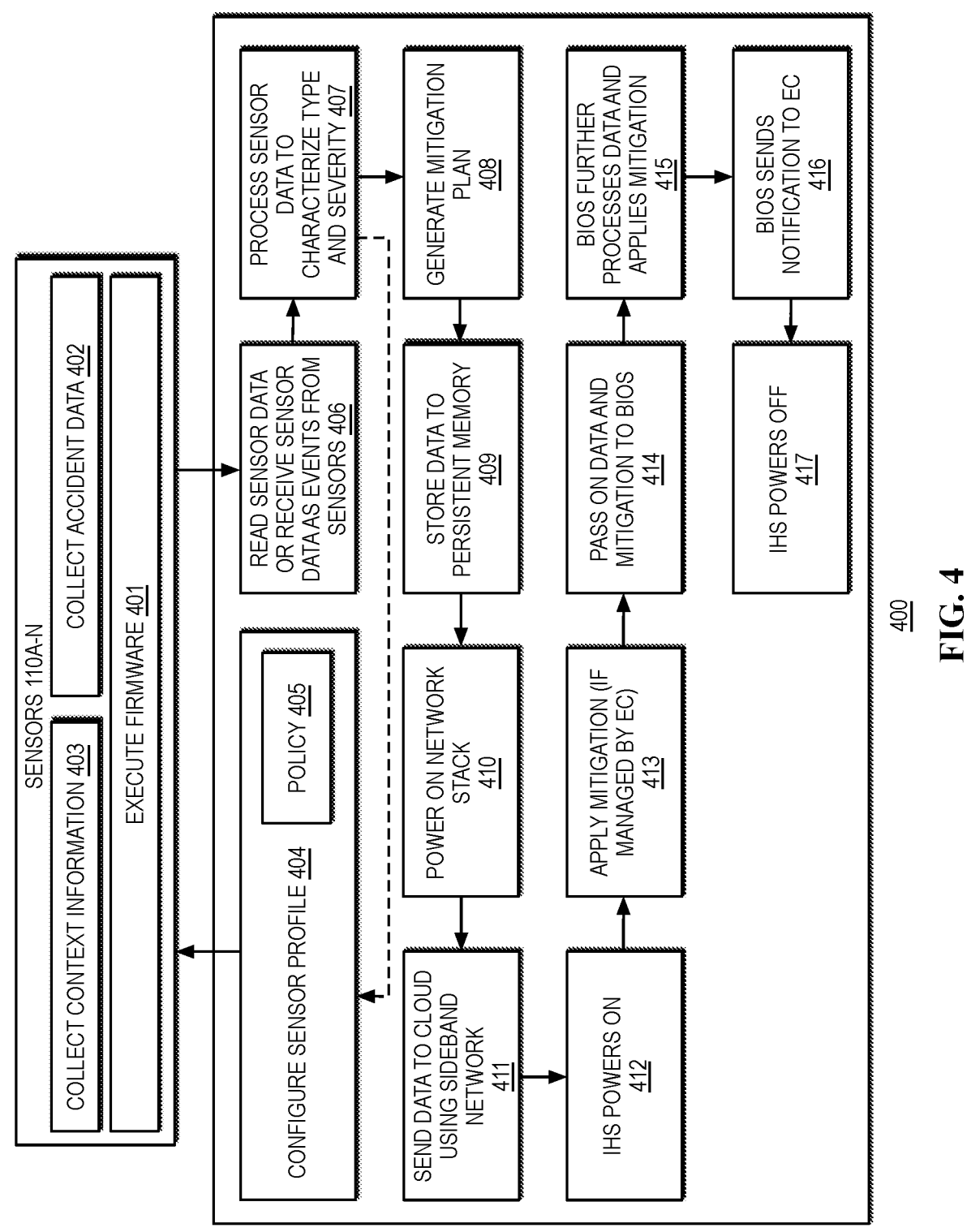
FIG. 4 is a diagram illustrating an example of a method for accident detection and handling by an Embedded Controller (EC), according to some embodiments.

In that regard, FIG. 4 is a diagram illustrating an example of method 400 for accident detection and handling. In various embodiments, method 400 may be performed by EC 109/215 and sensor(s) 110A-N.

Particularly, at 401 sensor(s) 110A-N execute their respective firmware and firmware services. At 402, sensor(s) 110A-N may collect data indicative of an accident (e.g., IHS velocity, acceleration, etc.), and at 403 sensor(s) 110A-N collect additional, contextual information (e.g., an IHS posture, location, etc.).

At 404, EC 109/215 configures the operating profiles of sensor(s) 110A-N, for example, based upon a policy received from policy services 306. For example, in some cases sensor data collection and/or reporting parameters (e.g., how frequency to sample data, threshold values, configuration settings, etc.) may be set up specifically for a particular context or situation depending upon one or more rules outlined in such a policy.

Generally speaking, polic(ies) may include rules for operating, configuring, selecting settings, etc. with respect to sensor settings, accident detection thresholds, and/or remediation or mitigation actions based, at least in part, upon contextual information. In some cases, a policy may be expressed as a JavaScript Object Notation or "JSON" file, an extensible Markup Language or "XML" file.

When executed or otherwise enforced, a policy may receive contextual information (e.g., an IHS location, a movement of the IHS, a time-of-day, an IHS posture, an IHS power state, etc.) and may map it, based upon the application of one or more rules, to one or more accident detection and handling commands, notifications, and/or settings. These accident detection and handling commands, notifications, and/or settings may be executed or applied in anticipation of, during, and/or after an accident (an "accidently detection and/or handling policy").

At 406, EC 109/215 reads sensor data and/or receives sensor data as event(s) from sensor(s) 110A-N ("accident data"). At 407, EC 109/215 process the accident data to detect and categorize an accident, as well as to determine its severity, likely damage to IHS components, etc. In some cases, the output of block 407 may be fed back into block 404 and used to modify existing policies, retire existing policies, or create new policies. At 408, EC 109/215 may also generate a mitigation or remediation plan for handling the accident.

In some cases, to perform the operations of blocks 407 and/or 408, EC 109/215 may execute one or more AI/ML models (locally, by its own processor core) and/or it may request that another device (e.g., processor(s) 101, AI engine 208, etc.) execute such models.

At 409, EC 109/215 stores accident data to persistent memory, such as storage 302. At 410, EC 109/215 powers on an in-band or OOB the network stack (if not yet running), and at 411 it sends the accident data to backend/remote services 305 on cloud 304 using an in-band or OOB communication channel.

In cases where IHS 100 is in a low-power state during the accident, at 412 EC 109/215 may turn IHS 100 turned back on (or wake it up). At 413, EC 109/215 executes at least a portion of the mitigation or remediation plan (e.g., by turning a fan off, limiting processor speeds, performing a Built-In-Self-Test or "BIST," etc.). EC 109/215 is generally always-on (it is coupled to an always-on power rail), and it is therefore uniquely well positioned to take certain remediation steps immediately upon the detection of an accident to mitigate its effects as early as possible.

At 414, EC 109/215 passes at least a portion of the accident data and/or mitigation or remediation plan to BIOS 107 when its participation is required (e.g., to configure a PCIe interface, etc.). At 415, BIOS 107 processes the accident data and executes any required mitigation or remediation operations. At 416, BIOS 107 sends a notification to EC 109/215 that the mitigation or remediation operations have been performed and/or their results, and at 417 EC 109/215 powers IHS 100 off.

As such, using method 400, EC 109/215 may intelligently use sensors 110A-N based on context and/or as defined by policy. For example, in some cases, if EC 109/215 detects no IHS movement the sensor profile may be configured to reduce battery consumption; but if EC 109/215 detects IHS movement indicative of walking, a sensor may be re-configured to increase its sampling rate.

In some cases, a policy may also indicate when or whether EC 109/215 should send the accident data to backend/remote services 305. For instance, a policy rule may require that, if the shock intensity of a particular accident is below than a threshold value, raw accident data (e.g., accelerometer data) not be transmitted to backend/remote services 305; but if the intensity is greater than the threshold, such accident data be transmitted.

Because method 400 may be performed by EC 109/215, the operations for accident detection and handling shown in FIG. 4 may be independent of the operation of OS 312. Moreover, because EC 109/215 is configured to establish an OOB or sideband connection with backend service 305, communications regarding policies and/or other notifications between them may also take place without intervention by OS 312, thus rendering these systems and methods OS-agnostic.

Figure 5:
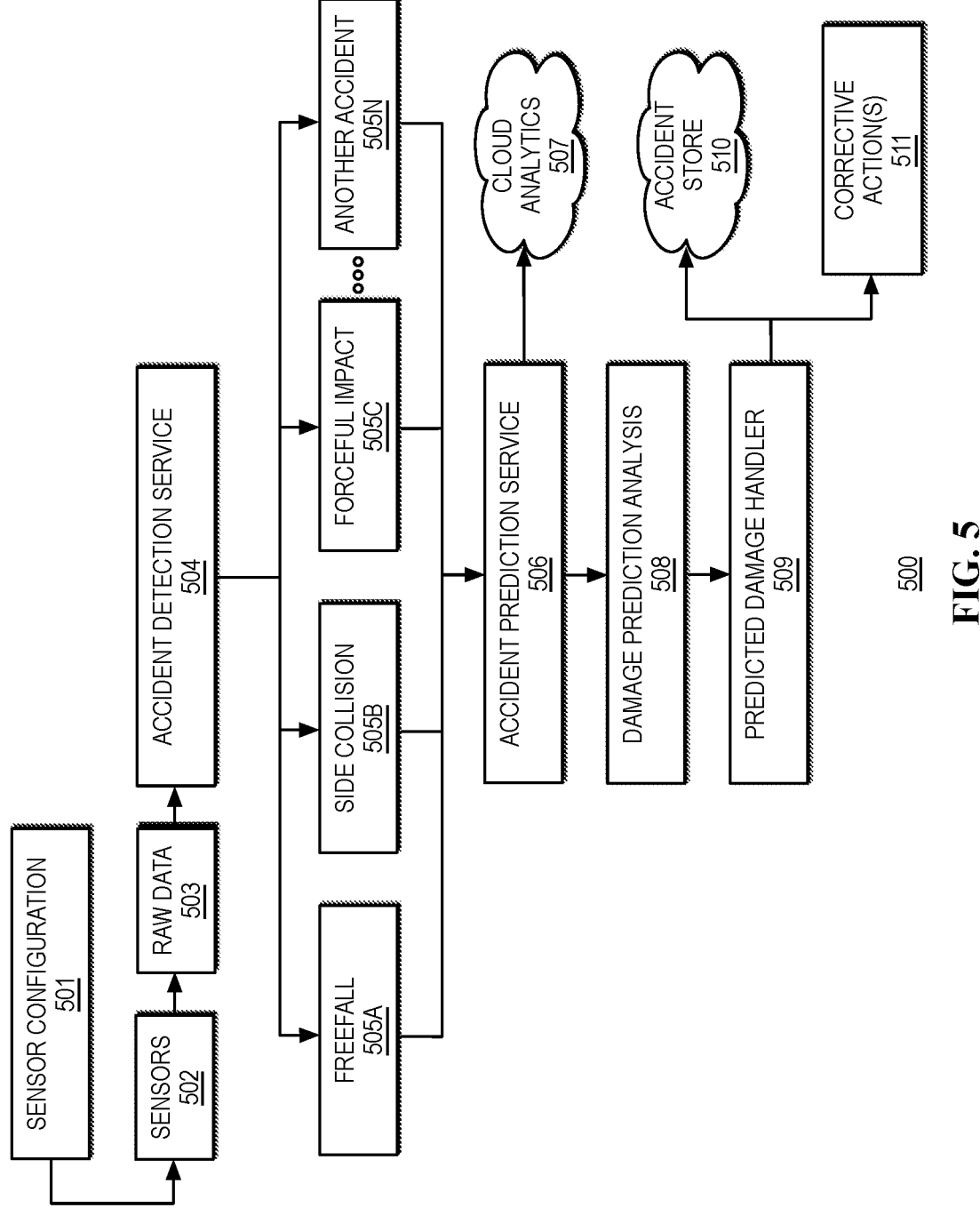
FIG. 5 is a diagram illustrating an example of a method for accident detection and handling by an Operating System (OS), according to some embodiments.

FIG. 5 is a diagram illustrating an example of method 500 for accident detection and handling. In contrast with method 400, method 500 may be performed by OS 312. It should be noted, however, that in some cases one or more operations shown in method 500 may also be performed by EC 109/215 as part of method 400.

At 501, method 500 includes configuring sensor(s) 502, for example, using a Graphical User Interface (GUI) or the like. In some cases, sensor(s) 502 may include hardware sensors 110 and/or software sensors configured to collect and/or produce raw data 503, and which is then provided to accident detection service 504.

Accident detection service 504 may be configured to process accident data 503 to detect and categorize an accident (as well as its severity), for example, as freefall 505A, side collision 505B, forceful impact 505C, or another any other discernible accident 505N. At 506, method 500 performs damage prediction analysis based, at least in part, upon accident data and/or inferences performed by accident detection service 504.

At 508, OS 312 produces or receives a damage prediction analysis, and at 509 predicted damage hander 509 implements remediation or mitigation actions 511 following the analysis and prior to OS 312 sending the accident data to a remote accident data store at 510. Examples of corrective action 511 include, but are not limited to, displaying an alert to a user of IHS 100, initiate diagnostic tests, etc.

To perform operations 504, 506, and/or 508, OS 312 may execute one or more AI/ML models and/or it may match each different type of accident to a particular accident signature. Moreover, based upon contextual information such as, for example, the type of IHS 100 (e.g., model), IHS form factor, IHS age, the type and severity of the accident, the IHS's accident and/or maintenance history, as well as a historical data of damage other sufficiently similarly simulated IHSs after having undergone sufficiently similar accidents, damage prediction service 506 may estimate the likelihood of damage to certain IHS components. Additionally, or alternatively, OS 312 may employ the use of cloud analytics 507 to perform these and other calculations.

Figure 6:
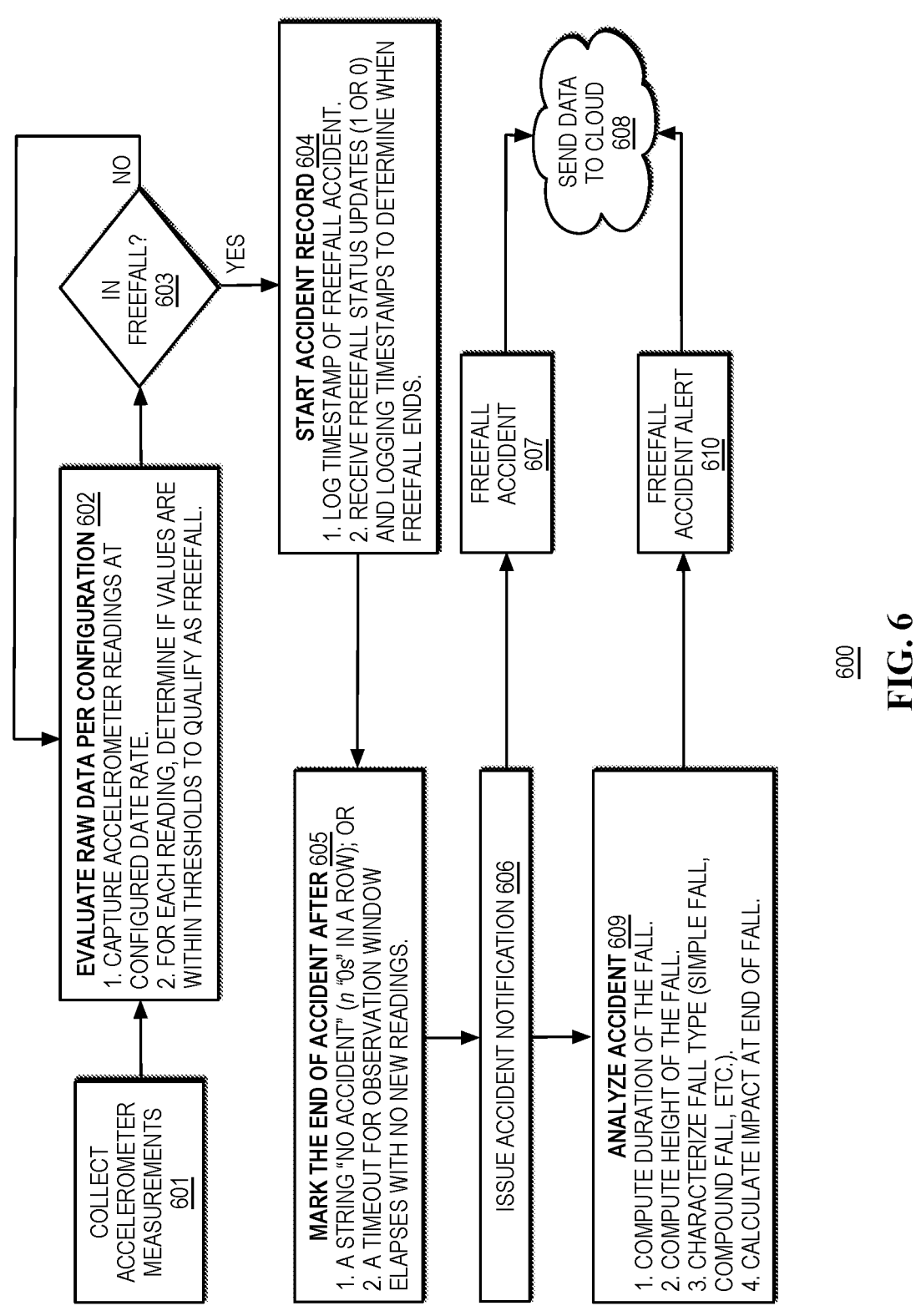
FIG. 6 is a diagram illustrating an example of a method for freefall detection with damage analysis, according to some embodiments.

FIG. 6 is a diagram illustrating an example of method 600 for freefall detection with damage analysis. In various embodiments, method 600 may be performed by EC 109/215 or host OS 312. Although this specific example refers specifically to freefall accidents, the same techniques may be applied to other types of accidents.

At 601, method 600 begins collecting or observing accelerometer (or other sensor) values. At 602, method 600 evaluates raw data with a selected configuration (e.g., from a policy). For example, method 600 may capture sensor readings at configured data rates, and for each reading, it may determine if values are withing thresholds that match those of a freefall.

At 603, method determines if IHS 100 is in freefall. It not, control returns to 602. If so, control passes to 604, where method 600 begins recording the accident. For example, method 600 may create a log/timestamp of the accident, receive freefall status updates (e.g., a binary status that indicates no-accident "0" or accident "1"), and log/time-stamp each update to determine when an accident ends.

At 605, method 600 marks the end of the accident after a number of status updates that show no freefall (e.g., 10 updates in a row with a "0" value) and/or after a timeout for the observation window elapses with no new readings.

Method 600 issues a freefall accident notification at 606, collects freefall accident data at 607, and then sends the data to backend/remote services 305 at 608. At 609, method 600 analyzes the freefall accident data. For example, it may compute a duration of the fall, a height of the fall, a type of fall (e.g., simple, compound or collated, etc.), and an impact at the end of the accident. Method 600 may then create a freefall accident alert at 610 based upon the foregoing computations, and it may send the alert to backend/remote services 305 at 608.

Figure 7:
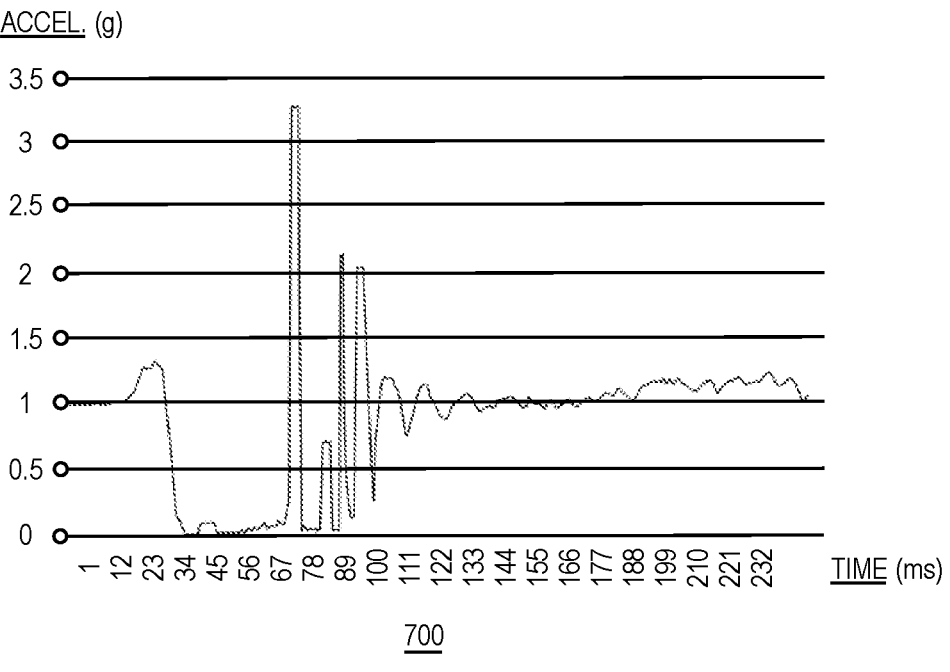
FIG. 7 is a diagram illustrating an IHS's acceleration during a freefall event on a mattress, according to some embodiments.

FIG. 7 shows graph 700 illustrating an IHS's acceleration during a freefall event on a mattress. In this example, graph 700 shows the magnitude of IHS 100's acceleration across XYZ axes as IHS 100 is dropped on a foam mattress, calculated as: $SqRt\ (aX^2+aY^2+aZ^2)$, where "a" is the acceleration measured along a given axis.

As shown in graph 700, IHS 100 is initially at rest on a surface, such that accelerometer senses and reports 1 g (the static acceleration acting upon IHS 100 due to gravity).

When IHS 100 is moved over the mattress and released, we see the acceleration magnitude drop to 0 at t=34 ms, which is indicative of a freefall accident. As IHS 100 hits the mattress at t=67 ms, the mattress exerts a counteracting force that causes the acceleration to spike as IHS 100 bounces upwards. IHS 100 quickly reaches the stationary point and starts falling, reaching freefall again at t=78 ms. From t=89 ms on, IHS 100 bounces a few more times at progressively smaller scale as the momentum decays until it comes to rest on the mattress, where static acceleration is back to 1 g.

Figure 8:
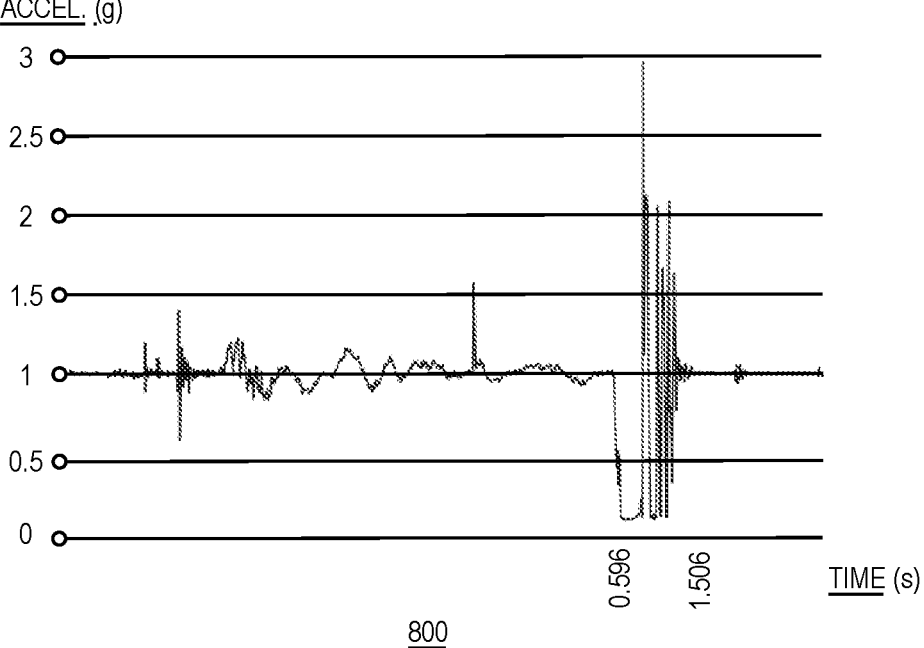
FIG. 8 is a diagram illustrating an IHS's acceleration during a freefall event on the floor, according to some embodiments.

FIG. 8 shows graph 800 illustrating an IHS's acceleration during a freefall event on the floor. Particularly, graph 800 shows the magnitude of IHS 100's acceleration across XYZ axes when a IHS 100 is dropped on a thin layer of cardboard box. In this example, we observe a freefall event at t=0.596 s. The keyboard box does cause bounce, and the magnitude is about a third of the magnitude in graph 700 above. IHS 100 settles back at rest around t=1.506 s.

Figure 9:
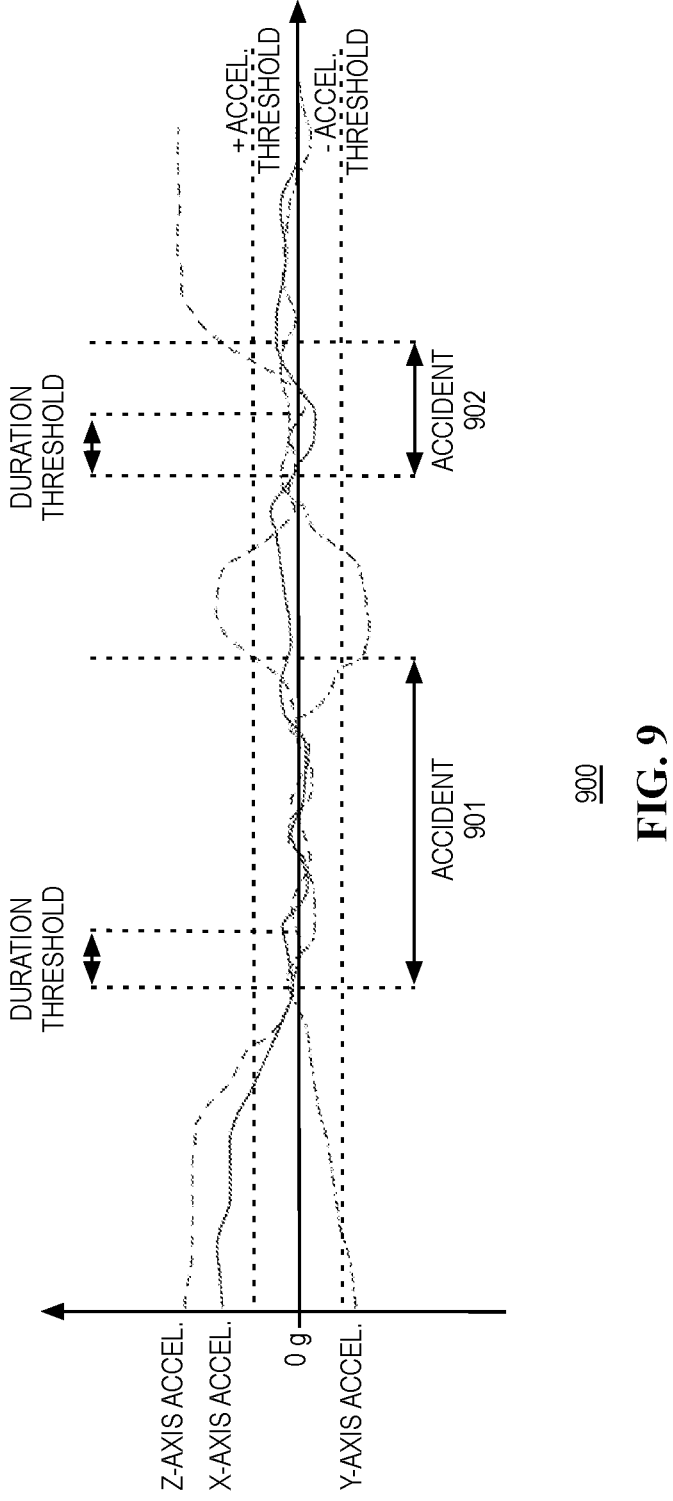
FIG. 9 is a diagram illustrating an accident collation technique, according to some embodiments.

FIG. 9 shows graph 900 illustrating an accident collation technique, as mentioned in block 609 of method 600, which may compute a type of fall, including compound or collated, etc. In this example, on their desk and accidentally drops IHS 100 to the floor. In that situation, data from an HDD may be lost due to active accesses connecting to the drive there are two accidents 901 or 902.

Each of accidents 901 and 902 is detected in response to its duration being longer the acceleration of IHS 100 being greater than an acceleration threshold (+/−) for longer than a duration threshold (to avoid false positives), respectively. Furthermore, in response to accidents 901 and 902 taking place within a selected time interval of each other, these two free fall accidents may be collated or combined as a single event (with two parts).

In some cases, systems and methods described herein may be implemented to achieve proactive system protection. For example, consider a situation where a user of IHS 100 is operating it during or after the drop. In other situations, a user may be walking with IHS 100 in a low power, sleep, or Modern Standby mode when it falls. In yet other situations, a user may be actively transferring data to or from IHS 100 when a shock event happens. In all of these situations, data and/or hardware are susceptible to corruption, destruction, etc.

Figure 10:
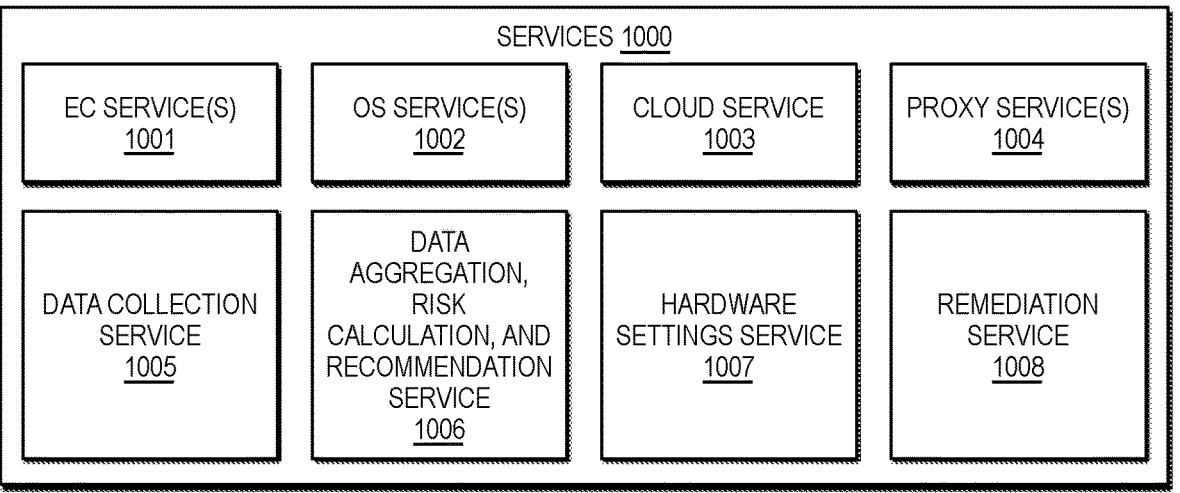
FIG. 10 is a diagram illustrating examples of services configured to proactively perform remediation following an accident, according to some embodiments.

To address these, and other issues, FIG. 10 is a diagram illustrating examples of services 1000 configured to proactively perform remediation following an accident. In various embodiments, one or more of services 1000 may be firmware services. Particularly, services 1000 may include EC service(s) 1001, OS service(s) 1002, cloud service 1003, proxy service(s) 1004, data collection service 1005, data aggregation, risk calculation, and recommendation service 1006, hardware setting service 1007, and remediation service 1008.

In some embodiments, one or more of services 1000 may operate to execute method 1100, as described below. As shown, EC service(s) 1001 may be executed by EC 109/215 (e.g., EC sensor processing service 323). OS service(s) 1002 and proxy service(s) 1004 may be executed by OS 312. Cloud service 1003 may be executed by cloud 304 (e.g., as backend/remote services 305).

Data collection service 1005 may be executed by sensors 110A-N, sensor hub 207, and/or EC 109/215. Data aggregation, risk calculation, and recommendation service 1006 may be executed by sensor hub 207 and/or EC 109/215. Hardware settings service 1007 may be executed by EC 109/215. Remediation service 1008 may be executed by sensor hub 207.

In operation, services 1000 may be configured to collect IHS 100 state settings from the available hardware and to perform remediation activities to prevent predicted system state mechanisms in a proactive manner.

For example, data collection service 1005 may run on hardware input devices (e.g., sensor hub 207, a battery charger, a fan sensor, etc.) and is responsible for collecting raw input. Service 1006 may perform data aggregation and/or risk calculation operations, and/or generate mitigation recommendations, for example, using one or more AI/ML models. Because EC 109/215 is a centralized IC with direct communication channels to other services, service 1006 may be configured to determine IHS 100's risk status position and creating recommendation actions to proactively protect hardware and/or data.

Hardware setting service 1007 may be executed by EC 109/215 and it may be configured to change one or more hardware settings in IHS 100 (e.g., processor speeds, communication ports, fans, hard drives, etc.), such as by turning it on/off, modifying its speed of frequency of operation, or the like. Remediation service 1008 may be configured to perform remediation action(s) recommended by service 1006. Cloud service 1003 may enable communications and storage of accident and event data to provide management interface pathways. Meanwhile, proxy services 1004 may enable tiered-status actions.

Figure 11:
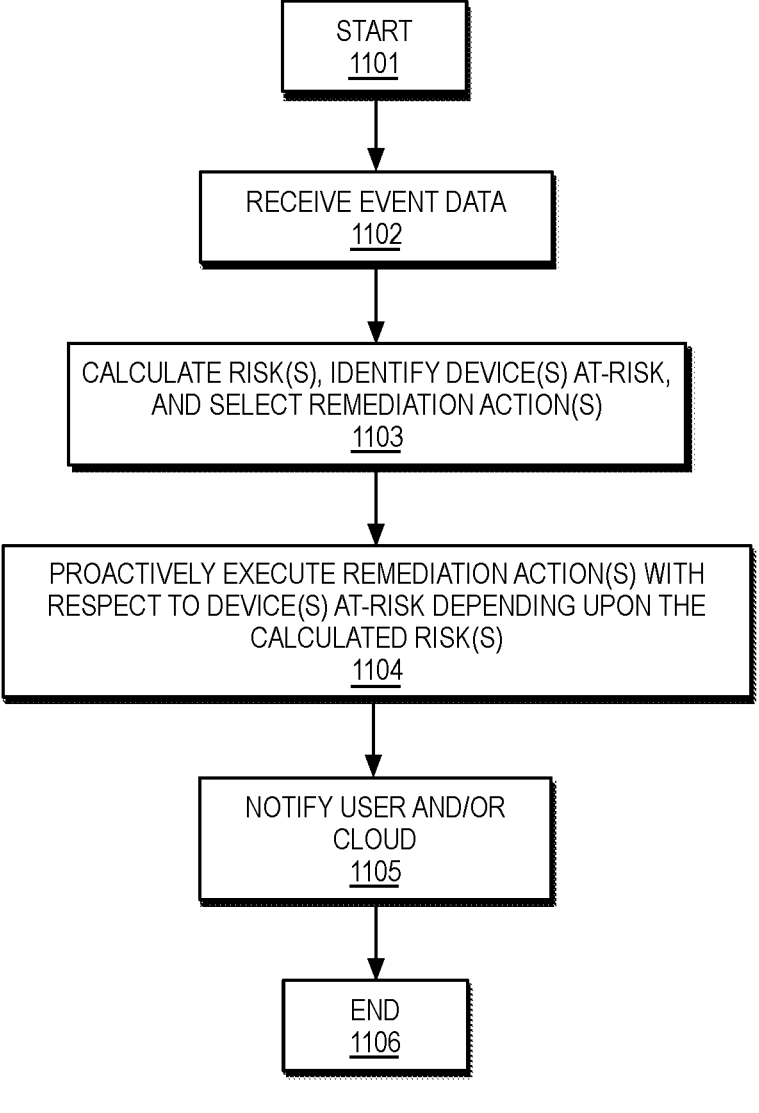
FIG. 11 is a diagram illustrating an example of a method for proactive remediation actions following an accident, according to some embodiments.

FIG. 11 is a diagram illustrating an example of method 1100 for proactive remediation actions following an accident. In various embodiments, method 1100 may be executed, at least in part, by one or more of services 1000. Particularly, method 1100 begins at 1101. At 1102, method 1100 receives event and/or accident data from one or more sensors 110A-N and/or sensor hub 207. At 1103, method 1100 may calculate risk(s), identify one or more devices at-risk, and select one or more remediation action(s). At 1104, method 1100 may proactively execute one or more remediation action(s) with respect to the device(s) at-risk depending, at least in part, upon their respective calculated risks. At 1105, method 1100 may notify a user or ITDM of the accident and/or damage, and it may store accident/damage data in cloud 504. Method 1100 ends at 1106.

As such, method 1100 may provide OS-agnostic, predictive/proactive protection based upon hardware detection inputs and inferred risks. Moreover, these systems and method provide advanced serviceability and detection mechanisms with real-time updates.

Consider now a situation where a user is carrying IHS 100 by their side when it drops to the floor, front edge first. The drop causes the webcam to be disconnected, which the user does not discover until the next time they to use it (e.g., at a subsequent remote meeting). In another situation, the user may throw a backpack with and IHS on to a desk, and later tries to use it without realizing that the internal touchpad cable was disconnected. In yet another situation, a user may drop their IHS and quickly pick it up thinking nothing of it, but they don't know that the USB port he uses to connect a scanner is broken until he tries to scan a document.

In the aforementioned scenarios, accidents may cause internal movement and/or damage that may render an internally connected peripheral or port (for external devices) inoperable or disconnected. Yet the user may not realize the extent of the internal damage until they try to use that feature as part of their daily work, which often leaves them scrambling to troubleshoot the issue with impending meetings or deadlines. Also, the user may not be able to attribute the malfunction to the accident (e.g., if they do not take notice of the accident).

To address these, and other concerns, systems and methods described herein may provide detection and notification of device ecosystem disruption following an accident.

Figure 12:
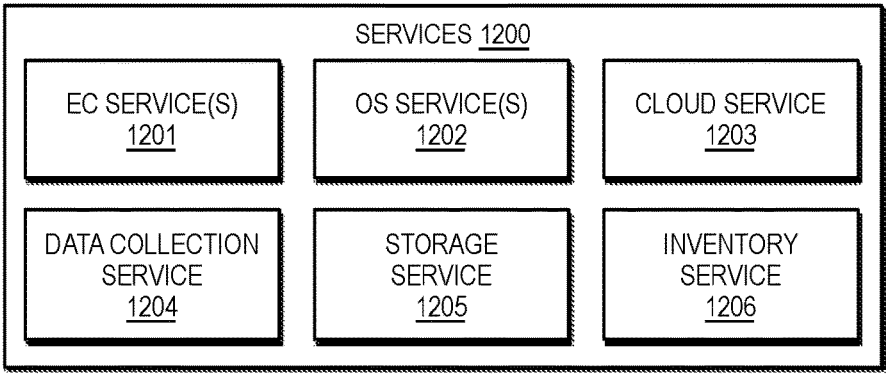
FIG. 12 is a diagram illustrating examples of services configured to detect and notify of an ecosystem disruption following an accident, according to some embodiments.

In that regard, FIG. 12 is a diagram illustrating examples of services 1200 configured to detect and notify of an ecosystem disruption following an accident. In various embodiments, one or more of services 1200 may be firmware services. Particularly, services 1200 may include EC service(s) 1201, OS service(s) 1202, cloud service 1203, data collection service 1204, storage service 1205, and inventory service 1206.

In various implementations, one or more of services 1200 may operate to execute method 1300 as described below. As shown, EC service(s) 1201 may be executed by EC 109/215 (e.g., EC sensor processing service 323). OS service(s) 1202 may be executed by OS 312. Cloud service 1203 may be executed by cloud 304 (e.g., as backend/remote services 305). Data collection service 1204 may be executed by sensors 110A-N, sensor hub 207, and/or EC 109/215. Storage service 1205 and inventory service 1206 may be executed by OS 312.

For example, data collection service 1204 may provide raw accident data to EC service(s) 1201 and/or OS service(s) 1202. EC service(s) 1201 may record an accident or event if IHS 100 is not in S0, and it may later notify OS service 1202. OS service 1202 may trigger inventory service 1206 to take inventory of IHS 100 and its components, and to make comparisons between a current inventory and previously collected inventories. Detected issues and other data may be saved by storage service 1205 and/or transmitted to cloud service 1203. In some cases, OS service 1202 may notify or prompt a user or ITDM of detected issues (e.g., problems with the inventory comparison).

In operation, services 1200 may be configured to perform one or more operations of method 1300. For example, inventory service 1206 may continually inventory or enumerate all internal devices/peripherals, as well as external devices connected via different ports. Upon detection of a fall/shock event, EC service(s) 1201 and/or OS service(s) 1202 get notified (depending on power state). Once IHS 100 is available, inventory service 1206 may be notified to take a complete inventory of IHS 100. The results are compared, and any unexpected discrepancies are recorded and transmitted to cloud service 1203.

In some cases, inventory service 1206 may include an AI/ML model configured to receive contextual information and to determine whether or not a discrepancy in inventory comparison is expected. Examples of contextual information may include, for example, a type of IHS (e.g., laptop vs. desktop vs. tablet), a location of IHS 100 (e.g., in an office, at home, etc.) a time-of-day, a day-of the week, an identification of a user of IHS 100, calendar information, remote meeting information, etc. For example, if a camera is missing from a current component inventory but the last inventory was taken when the user was at work and now user is at home, the camera's disappearance may be deemed expected.

The user may then be notified and prompted to take further action, including confirming with a particular component's disappearance was expected, running diagnostic tests, contacting their IT department and/or the IHS's OEM, etc.

FIG. 13 is a diagram illustrating an example of method 1300 for detecting and notifying of an ecosystem disruption following an accident. In various embodiments, method 1300 may be executed, at least in part, by one or more of services 1200.

At 1301, method 1300 starts. At 1302, IHS 100 is in an S0 state. At 1303, sensor hub 207 monitors accidents and events. When an accident is detected at 1304, method 1300 samples and processes accident data (e.g., raw sensor data). At 1306, method 1300 reports accidents and/or events to EC 109/215 and/or OS 312.

EC 109/215 notifies other service(s) at 1307, and it scans components and devices coupled to IHS 100 at 1308 before method 1300 ends at 1309. Meanwhile, OS 312 notifies other service(s) at 1310, provides user and/or cloud notifications at 1311, and reports to inventory service 1206 at 1312. Inventory service 1206 scans components or devices at 1313, before method 1300 ends at 1309.

As such, method 1300 may provide immediate detection of internal device/component damage, cable disconnections, and port malfunctions following accidents. It may also provide an automatically triggered comparison of a current inventory against regularly captured inventories to help with early detection/mitigation before work failure or stoppage. Discrepancies may be intelligently filtered before and/or during user notification to avoid false alarms (e.g., when a seemingly "disappeared" device is simply not yet connected, as determined based upon an IHS location and/or calendar/meeting information).

Systems and methods described herein enable assessing display health in response to accidents. In some situations, a user may have IHS 100 on a desk (e.g., in S0 mode) or the user may be carrying 100 (e.g., in Modern Standby, sleep mode, etc.) when IHS 100 falls to the ground. As a result of the accident, the integrated LCD display (e.g., 111) may crack, shatter, or otherwise break.

Later, an ITDM, OEM, or reseller of IHS 100 may receive a support call from the user requesting to troubleshoot LCD cracks, video distortion, broken chassis, and/or stability issues (e.g., shutdown, overheating, etc.) with IHS 100; often without much visibility into whether IHS 100 has been in an accident.

To address these, and other concerns, systems and methods for assessing display health in response to accidents are described herein. In various implementations, these systems and methods may run in firmware services to collect sensor from available hardware, detect an accident, and log the accident in EC 109's managed NVRAM. In accidents where IHS 100 suffers a shutdown or reboot, EC 109 may trigger an LCD Built-In-Self-Test (BIST) on next reboot.

Figure 14:
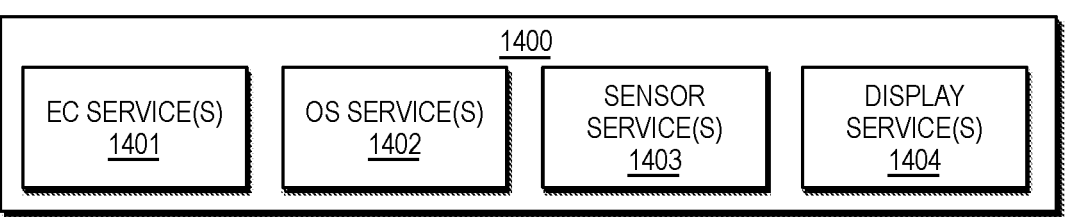
FIG. 14 is a diagram illustrating examples of services for assessing display health in response to accidents, according to some embodiments.

In that regard, FIG. 14 is a diagram illustrating examples of services 1400 for assessing display health in response to accidents. In various embodiments, one or more of services 1400 may be firmware services. Particularly, services 1400 may include EC service(s) 1401, OS service(s) 1402, sensor service(s) 1403, and display service(s) 1404.

As shown, EC service(s) 1401 may be executed by EC 109/215 (e.g., EC sensor processing service 323). Sensor service(s) 1402 may be executed by sensor hub 207 and/or sensor(s) 110. OS service(s) 1402 may be executed by OS 312. Meanwhile, display service(s) may be executed by display controller 104 and/or 209.

In various implementations, one or more of services 1400 may operate to execute method 1500, as described below. For example, EC service(s) 1401 may be responsible for detecting a type of accident, determining a severity or intensity of a shock event, and identifying devices at risk of damage (including I/O ports, connectors, etc. and externally coupled devices) based, at least in part, upon data received from sensor service(s) 1402.

EC service(s) 1401 may also be configured for selecting or creating prioritized recovery or mitigation operations, as determined by an AI/ML model and/or accident handling policy. For example, EC service(s) 1401 may measure and evaluate a display's health indication. Depending upon the value of the health indication, EC service(s) 1401 may performed a selected one or more mitigation or remediation operations.

In some cases, EC service(s) 1401 may instruct BIOS 107 to create an Advanced Configuration and Power Interface (ACPI) table that contains an indication of display health and/or changes to one or more display settings or parameters. OS service(s) 1402 may retrieve the ACPI table and take additional action, such as, for example, performing advanced diagnostics, interacting with a user of IHS 100, etc. In other cases (e.g., where the accident happens in S0 and IHS 100 does not reboot, EC may also communicate the accident to OS service(s) 1402 using a System Control Interrupt (SCI) or Windows Management Instrumentation (WMI) methods.

Figure 15:
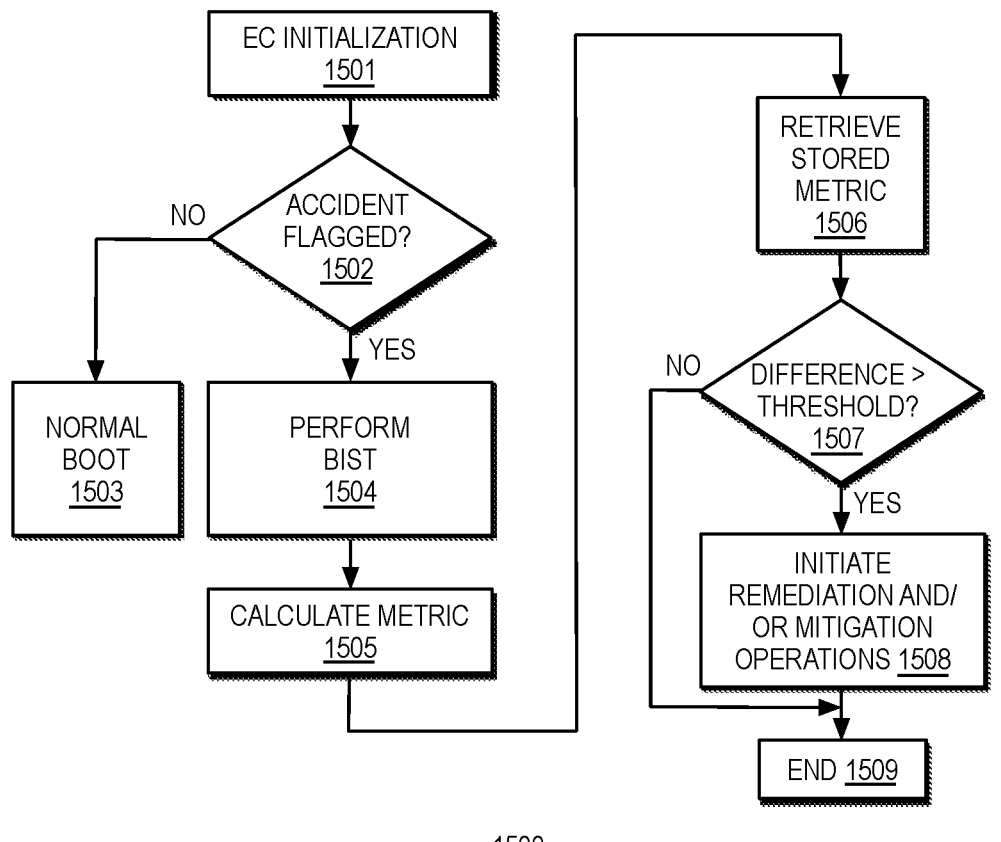
FIG. 15 is a diagram illustrating an example of a method for assessing display health in response to accidents, according to some embodiments.

FIG. 15 is a diagram illustrating an example of method 1500 for assessing display health in response to accidents. In various embodiments, method 1500 may be executed, at least in part, by one or more of services 1400.

Method 1500 starts at 1501 where EC 109/215 is initialized. At 1502, EC service(s) 1401 determines if IHS 100 suffered an accident (e.g., prior to a reboot). If so, at 1503, EC service(s) 1401 may put IHS 100 in S5 mode and trigger execution of an LCD BIST, for example, by communicating with display controller 104/209. In some cases, depending upon the type and/or severity of the accident, a different BIST may be performed (e.g., a "comprehensive" test with more telemetry when the accident is more severe, a "targeted" test with less telemetry when the accident is less severe, etc.).

To perform the BIST, display controller 104/209 may measure a display's electrical current levels or signals. For example, EC service(s) 1401 may send a command to display controller 104/209 to run various color patterns by sending HEX command codes (e.g., while IHS 100 is in S5), and it may measure one or more noise levels (e.g., pixel noise, image noise, luminance or color noise, etc.).

At 1505, based upon results of the BIST, display controller 104/209 and/or EC service(s) 1401 calculates a current value of a display metric, such a noise metric (e.g., using an AI/ML model, etc.). At 1506, EC service(s) 1401 retrieves a stored value for the same metric (e.g., from an NVRAM, and at 1507 EC service(s) 1401 compares the two values.

At 1507, if the difference between the stored value (e.g., factory value) and the current value is smaller than a threshold, method 1500 ends at 1509. Conversely, if the difference is greater than the threshold, then at 1508 EC service(s) 1401 may initiate one or more remediation and/or mitigation operations.

In some cases, EC service(s) 1401 may also characterize a type of damage, or a severity of the damage using the display telemetry and/or calculated metrics based, at least in part, upon a policy and/or execution of an AI/ML model.

To select a remediation and/or mitigation operation, EC service(s) 1401 may enforce an accident handling policy that includes, for a given type of accident, severity, etc., one or more actions to be initiated. Additionally, or alternatively, EC service(s) 1401 may execute an AI/ML model to select one or more actions to be initiated. For example, after detecting an accident or shock event (e.g., with a severity or intensity above a selected minimum threshold level), EC service(s) 1401 may instruct display service(s) 1404 to reduce a maximum display brightness by a predetermined amount.

Examples of display settings that may be changed in response to the accident include, but are not limited to: a brightness, a color depth, a refresh frequency, a frame rate, etc. In some cases, the magnitude of the reduction to a display setting's value (e.g., a reduced brightness due to a reduced display health metric) may be proportional to a magnitude or severity of the accident.

Additionally, or alternatively, in response to the accident, the IHS to notify a user of the IHS to connect IHS 100 to an external display.

As such, method 1500 may enable IHS 100 to assess a display's health and/or configure a display in response to an accident. Moreover, method 1500 may enable IHS 100 to re-configure a display's settings, parameters, features, and/or behaviors in response to accidents. These systems and methods may also allow a user to better manage the use of external devices in order to preserve an IHS's integrated display after an accident.

To implement various operations described herein, computer program code (i.e., program instructions for carrying out these operations) may be written in any combination of one or more programming languages, including an object-oriented programming language such as Java, Smalltalk, Python, C++, or the like, conventional procedural programming languages, such as the "C" programming language or similar programming languages, or any of machine learning software. These program instructions may also be stored in a computer readable storage medium that can direct a computer system, other programmable data processing apparatus, controller, or other device to operate in a particular manner, such that the instructions stored in the computer readable medium produce an article of manufacture including instructions which implement the operations specified in the block diagram block or blocks.

Program instructions may also be loaded onto a computer, other programmable data processing apparatus, controller, or other device to cause a series of operations to be performed on the computer, or other programmable apparatus or devices, to produce a computer implemented process such that the instructions upon execution provide processes for implementing the operations specified in the block diagram block or blocks.

Modules implemented in software for execution by various types of processors may, for instance, include one or more physical or logical blocks of computer instructions, which may, for instance, be organized as an object or procedure. Nevertheless, the executables of an identified module need not be physically located together but may include disparate instructions stored in different locations which, when joined logically together, include the module and achieve the stated purpose for the module. Indeed, a module of executable code may be a single instruction, or many instructions, and may even be distributed over several different code segments, among different programs, and across several memory devices.

Similarly, operational data may be identified and illustrated herein within modules and may be embodied in any suitable form and organized within any suitable type of data structure. Operational data may be collected as a single data set or may be distributed over different locations including over different storage devices.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs.

As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

The invention claimed is:

1. An Information Handling System (IHS), comprising:
an Embedded Controller (EC); and
a memory coupled to the EC, wherein the memory comprises program instructions that, upon execution by the EC, cause the IHS to initiate an integrated display's Built-In-Self-Test BIST) in response to a determination that the IHS suffered an accident indicated by an accident flag or register;
initiate the BIST on a next boot of the IHS, wherein the BIST is configured to:
measure one or more electrical currents;
determine, based at least in part upon the measurement, whether the integrated display has suffered damage associated with the accident; and
identify, based at least in part upon the one or more electrical currents, a type of the damage and a severity of the damage.

2. The IHS of claim 1, wherein the accident comprises at least one of: a drop, a fall, a throw, a hit, a crash, an impact, or a collision involving the IHS or a component thereof.

3. The IHS of claim 1, wherein the accident takes place while the IHS is in Modern Standby or low-power state.

4. The IHS of claim 1, wherein the program instructions, upon execution by the EC, cause the IHS to enter an S5 state prior to initiation of the BIST.

5. The IHS of claim 1, wherein to initiate the BIST, the program instructions, upon execution by the EC, cause the IHS to communicate with a display controller.

6. The IHS of claim 1, wherein the one or more electrical currents is indicative of an image noise level of the integrated display.

7. The IHS of claim 1, wherein the program instructions, upon execution by the EC, further cause the IHS to identify the type or severity of the damage based, at least in part, upon a policy.

8. The IHS of claim 1, wherein the program instructions, upon execution by the EC, further cause the IHS to identify the type or severity of the damage based, at least in part, upon execution of an Artificial Intelligence (AI) or Machine Learning (ML) model.

9. A memory device having program instructions stored thereon that, upon execution by a processor of an Information Handling System (IHS), cause the IHS to:
determine that the IHS suffered an accident indicated by an accident flag or register; and
initiate an integrated display's Built-In-Self-Test (BIST) on a next boot of the IHS, at least in part, in response to the determination, wherein the BIST is configured to:
measure one or more electrical currents;
determine, based at least in part upon the measurement, whether the integrated display has suffered damage associated with the accident; and
identify, based at least in part upon the one or more electrical currents, a type of the damage and a severity of the damage.

10. A method, comprising:
receiving an instruction, at a Liquid Crystal Display (LCD) controller from an Embedded Controller (EC) within an Information Handling System (IHS), to perform a Built-In-Self-Test (BIST) on a next boot of the IHS in response to an accident indicated by an accident flag or register, wherein the BIST:
measures one or more electrical currents;
determines, based at least in part upon the measurement, whether an LCD display coupled to the IHS has suffered damage associated with the accident; and
identifies, based at least in part upon the one or more electrical currents, a type of the damage and a severity of the damage; and
providing a result of the BIST to the EC.

11. The method of claim 10, wherein the one or more electrical currents is indicative of an image noise level of the LCD display.

12. The method of claim 11, wherein the BIST determines whether the damage comprises a cracked screen.

13. The memory device of claim 9, wherein the one or more electrical currents is indicative of an image noise level of the integrated display.

* * * * *